United States Patent [19]

Sugo

[11] Patent Number: 5,029,116
[45] Date of Patent: Jul. 2, 1991

[54] OSCILLOSCOPE OPERATION SUPPORTING DEVICE

[75] Inventor: Hiroyuki Sugo, Katsuta, Japan

[73] Assignee: Hitachi Automobile Appliances Sales Company, Ltd., Tokyo, Japan

[21] Appl. No.: 285,645

[22] Filed: Dec. 16, 1988

[30] Foreign Application Priority Data

Dec. 17, 1987 [JP] Japan .................................. 62-317516
Dec. 17, 1987 [JP] Japan .................................. 62-317517
Dec. 23, 1987 [JP] Japan .................................. 62-323680
Mar. 17, 1988 [JP] Japan .................................. 63-61973

[51] Int. Cl.$^5$ ......................................... G01R 13/20
[52] U.S. Cl. .................................... 364/550; 364/487
[58] Field of Search ............... 364/518, 521, 146, 147, 364/481, 483, 487, 550, 569, 579, 580, 571.01, 482, 484

[56] References Cited

U.S. PATENT DOCUMENTS 4,743,844 5/1988 Odenheimer et al. ............... 364/487
4,758,963 7/1988 Gordon et al. ..................... 364/481
4,763,117 8/1988 Blattner et al. ..................... 364/481
4,812,996 3/1989 Stubbs ............................... 364/521
4,823,283 4/1989 Diehm et al. ....................... 364/146

FOREIGN PATENT DOCUMENTS 0074235 3/1983 European Pat. Off. ............ 364/487

Primary Examiner—Parshotam S. Lall
Assistant Examiner—Michael Zanelli
Attorney, Agent, or Firm—Oblon, Spivak, McClelland, Maier & Neustadt

[57] ABSTRACT

An oscillosope operation supporting device which assures easy and correct use of an oscilloscope by an operator unfamilar with such an instrument. The device is used in combination with an oscilloscope and comprises a controlling means, an operator guide display unit, and a confirmation signal inputting means. Operation procedures for individual functions of initialization, calibration, measurement and data storage of the oscilloscope are indicated in a predetermined order on the operator guide display unit. An operator will operate the oscilloscope only in accordance with the operation procedures indicated on the display unit.

35 Claims, 23 Drawing Sheets

POWER ON. AFTER ABOUT 15 SECONDS, TURN BRIGHTNESS ADJUSTING KNOB CLOCKWISE UNTIL BRIGHT LINE APPEARS.
TURN FOCUSING KNOB TO SHARPEN BRIGHT LINE.

FOR BOTH OF FIRST AND SECOND CHANNELS, SET INPUT COUPLING SYSTEM SETTING KNOBS TO DC, VOLTAGE AXIS SETTING KNOBS TO 0.5VOLTS/DIV., TIME AXIS SETTING KNOB TO 10MILLISECONDS, AND VARIABLE KNOBS OF THOSE KNOBS TO CALIBRATION POSITION

FIRST CHANNEL
  VERTICAL 0.5 VOLTS/DIV.(Vp=15 VOLTS) HORIZONTAL 2 MILLISECONDS/DIV.(f=100Hz)
SECOND CHANNEL
  VERTICAL 0.5 VOLTS/DIV.(Vp=13 VOLTS) HORIZONTAL 20 MILLISECONDS/DIV.(f=10Hz)

FIG. 13

```
FETCHING TIME ; 1 = 10 MILLISECONDS. 2 = 0.1 SECOND.
              3 = 1 SECOND. 4 = 10 SECONDS.
              5 = 100 SECONDS   SET NO. = 1   OK ?
```

FIG. 14

```
TRIGGER SOURCE = EXTERNAL. VERTICAL AXIS MODE = CH1.
KNOB = 5 VOLTS. (Vp = 15 VOLTS). HORIZONTAL AXIS = 1
MILLISECOND. (READING OF MEMORY = 1 SECOND/DIV.) OK ?
```

FIG. 20

```
FETCHING TIME ; 1 = 10 MILLISECONDS. 2 = 0.1 SECOND.
              3 = 1 SECOND. 4 = 10 SECONDS.
              5 = 100 SECONDS   SET NO. = 1  OK ?
```

FIG. 21(a) INPUT SIGNAL TO CH1
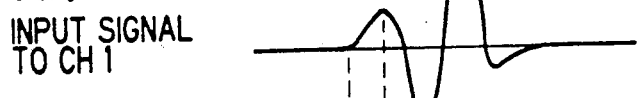
FIG. 21(b) OUTPUT OF DIFFERENTIATOR CIRCUIT 181
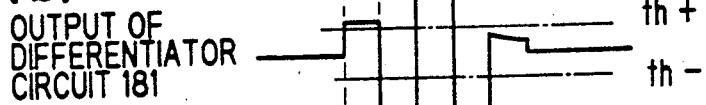
th +
th −
FIG. 21(c) OUTPUT OF COMPARATOR CIRCUIT 182
FIG. 21(d) PROCESSING OF MPU 160
STARTING POINT → DATA FETCHING
FIG. 21(e) OUTPUT OF DIFFERENTIATOR CIRCUIT 181
FIG. 22
TRIGGER SOURCE = EXTERNAL, VERTICAL AXIS MODE = CH1, KNOB = 0.5 VOLTS, (Vp = 15 VOLTS), HORIZONTAL AXIS = 1 MILLISECOND, (READING OF MEMORY = 1 SECOND/DIV.) OK ?
FIG. 23
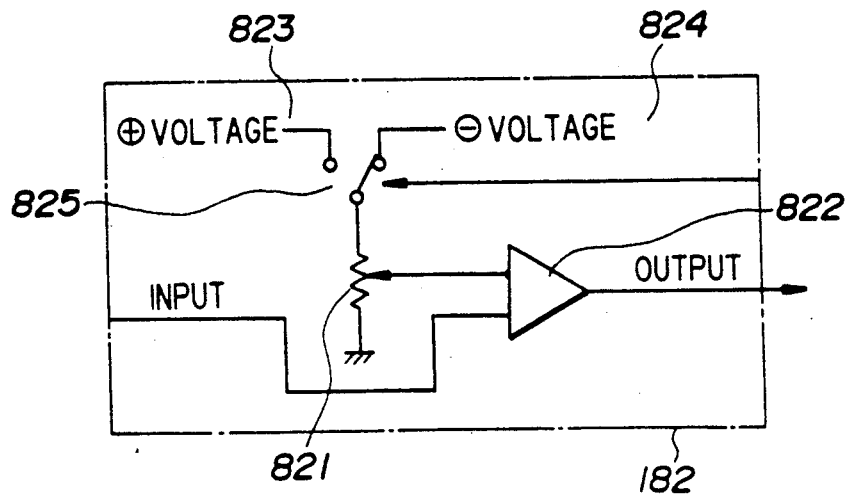

FUEL INJECTION VALVE SIGNAL

TRIGGER SIGNAL

DATA FETCHING TIMING $t$

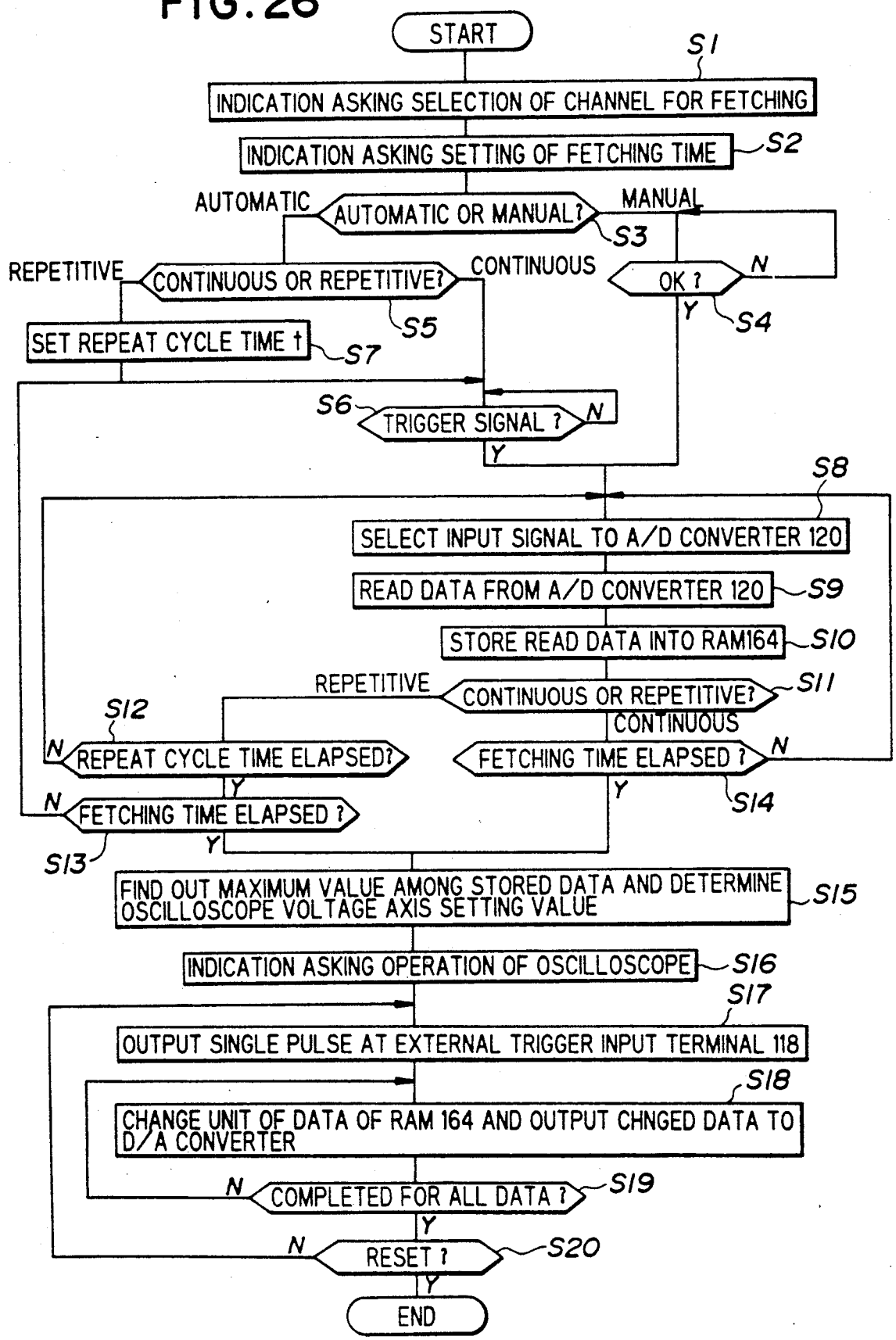

FIG. 32

```
SET NUMBER OF HORIZONTAL ROWS FOR INDICATION
( 1 TO 8 ) SET = 2  OK ?
```

FIG. 33

```
SET TIME FOR MASKING FROM TRIGGER SIGNAL
SET = 5 MILLISECONDS  OK ?
```

FIG. 34

```
SET OSCILLOSCOPE TRIGGER TO EXTERNAL. ADJUST TRIGGER
LEVEL KNOBS OF OSCILLOSCOPE AND SUPPORTING
DEVICE UNTIL DISPLAY IS STABILIZED (VERTICAL 2 VOLTS/
DIV.. HORIZONTAL f/10)  OK ?
```

FIG. 35

```
MASK TIME SHIFT    SET SWITCH <--, OK SWITCH -->
MASK TIME = 16 MILLISECONDS
```

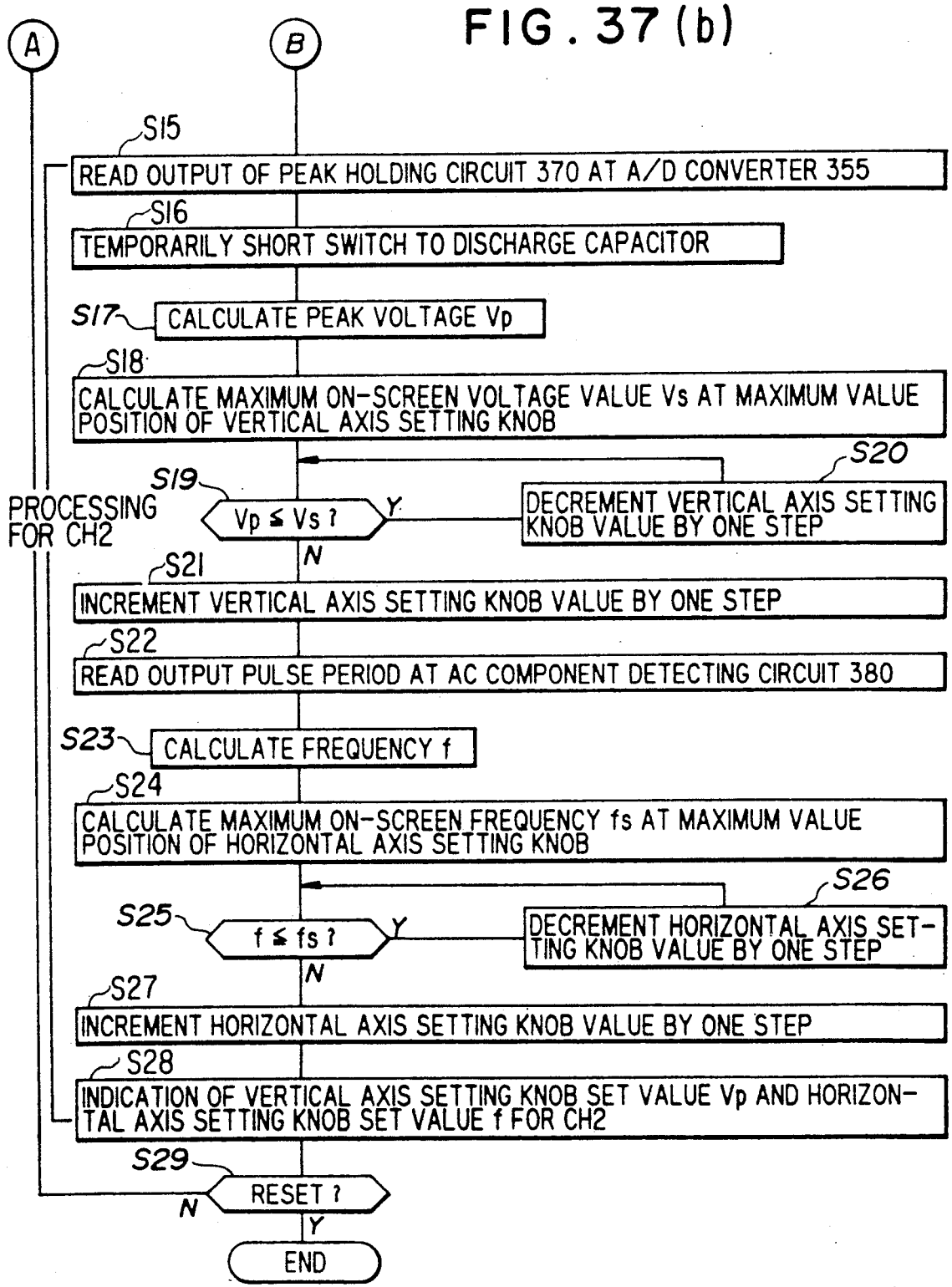

ABSTRACT

OSCILLOSCOPE OPERATION SUPPORTING DEVICE

BACKGROUND OF THE INVENTION

1. Field of the Invention

This invention relates to an operation supporting device for an oscilloscope which is used for maintenance, inspection and so on of, for example, an automobile, and more particularly to an oscilloscope operation supporting device by which means an oscilloscope can be operated readily and accurately by a person who has only poor knowledge of electricity and so on.

2. Description of the Prior Art

When various signals are to be measured using an oscilloscope, it is necessary to set a plurality of relevant knobs or switches individually to predetermined positions in advance. Further, in order to produce an indication of a waveform on a screen of the oscilloscope to obtain correct information of a peak value or a frequency of the waveform, some expert knowledge of electricity is required.

Meanwhile, electronic devices such as a microcomputer has been progressively employed in recent automobile appliances. Accordingly, now an oscilloscope is a measuring instrument which is requisite for maintenance and inspection of an automobile.

In an automobile maintenance field at present, the number of operators who can freely use an oscilloscope is small. Accordingly, development of an oscilloscope operation supporting device for supporting operation of an oscilloscope is expected strongly.

In order to reduce steps of operation of an oscilloscope, a proposal has been made and is disclosed in Japanese Patent Laid-Open No. 59-148876. The proposal disclosed involves an invention wherein deflection sensitivities of an arbitrary number of vertical input channels of an oscilloscope are all normalized automatically by a gain matching process in order to enable accurate measurement of a magnitude of a waveform.

The proposal, however, provides reduction in number of man-hours regarding only one vertical axis knob among a large number of knobs provided on an oscilloscope. Accordingly, from a point of view of a total number of man-hours for operation by an operator, such operations as an operation for adjustment of a brightness and focusing on a screen of the oscilloscope, operation of knobs for trigger, calibrating operation of a scale, probe-matching operation and some other initializing operations are still required. The proposal does not thus attain significant reduction in number of man-hours. Besides, since the means of the proposal is built in the oscilloscope, the function is available only with the oscilloscope and not with a separate oscilloscope.

Another proposal is disclosed in Japanese Patent Laid-Open No. 54-100780. The proposal involves an invention which adopts a waveform checking system wherein information of operation of an oscilloscope or information of a standard width of a waveform is indicated on a screen in front of a Braun tube of the oscilloscope using figures, characters and so on so as to facilitate operation of the oscilloscope and permit comparison and checking of a waveform being observed.

Even with the prior art, a transition segment of a signal is too short, and a pulse waveform having a long cycle period cannot be observed appropriately.

SUMMARY OF THE INVENTION

It is an object of the present invention to provide an oscilloscope operation supporting device by which means any oscilloscope on the market can be used readily and correctly without previous knowledge of it.

It is another object of the present invention to provide an oscilloscope operation supporting device which is capable of storing data therein but is inexpensive.

It is a further object of the present invention to provide an oscilloscope operation supporting device wherein, in combination with an inexpensive oscilloscope on the market, an input signal can be edited and an actual waveform can be displayed on a screen of the oscilloscope.

In order to attain the objects, according to one aspect of the present invention, there is provided an oscilloscope operation supporting device for use with an oscilloscope, which comprises a controlling means, an operator guide display unit, and a confirmation signal inputting means, whereby operation procedures for individual functions of initialization, calibration, measurement and data storage of an oscilloscope connected to the oscilloscope operation supporting device are indicated in a predetermined order on the operator guide display unit.

With the oscilloscope operation supporting device, various functions of an oscilloscope can be used readily and accurately by an operator who has no expert knowledge of it.

According to another aspect of the present invention, there is provided an oscilloscope operation supporting device for use with an oscilloscope, which comprises a controlling means for processing data, a memory for storing data therein, a display means for displaying information of operation of an oscilloscope connected to the oscilloscope operation supporting device, an analog to digital converter, and a digital to analog converter, whereby a signal for measurement from an appliance to be measured is fetched repetitively for a predetermined period of time, and data of the signal thus fetched are processed by the controlling means and stored into the memory thereby to enable the data to be reproduced on a screen of the oscilloscope when required.

Accordingly, the oscilloscope operation supporting device is inexpensive but has high functions. The oscilloscope operation supporting device improves various characteristics of an oscilloscope such as operability, accuracy in inspection and inspection efficiency.

According to a further aspect of the present invention, there is provided an oscilloscope operation supporting device for use with an oscilloscope, which comprises an automatic fetching starting means for automatically starting fetching of a signal from an appliance to be measured, a data processing means for receiving and processing the signal from the appliance to be measured, a memory means for storing therein the data processed by the data processing means, an analog to digital converter, and a digital to analog converter, whereby fetching of the signal from the appliance to be measured is continued for a preset period of time after having been automatically started by the automatic fetching starting means, and data of the signal thus fetched are stored into the memory means thereby to enable, when required, the stored data to be converted into analog data, outputted to an input terminal of an oscilloscope connected to the oscilloscope operation supporting device and indicated on a screen of the oscilloscope.

The oscilloscope operation supporting device is inexpensive but has high functions. The device is very effective in improvements in reliability in maintenance of an appliance by an oscilloscope and also in processing ability of such an oscilloscope.

According to a still further aspect of the present invention, there is provided an oscilloscope operation supporting device for use with an oscilloscope, which comprises an automatic signal fetching means for automatically detecting a timing at which a signal is delivered from an appliance to be measured, a data processing means for processing a signal fetched by the automatic signal fetching means, and an adding means for adding a predetermined signal to the signal from the appliance to be measured, whereby an output of the automatic signal fetching means and an output of the adding means are outputted to input terminals of an oscilloscope connected to the oscilloscope operation supporting device so that a waveform of the signal may be displayed on a screen of the oscilloscope.

Also the oscilloscope operation supporting device is inexpensive but has high functions. The device is very effective in improvements in reliability in maintenance of an appliance by an oscilloscope and also in processing ability of such an oscilloscope.

According to a yet further aspect of the present invention, there is provided an oscilloscope operation supporting device for use with an oscilloscope, which comprises a trigger circuit for detecting a timing at which a signal is delivered from an appliance to be measured, a data processing means for receiving and processing data of an output signal fetched from the appliance to be measured and an output signal of the trigger circuit, an adding means for adding a predetermined signal to the signal fetched from the appliance to be measured, an operation information inputting means capable of inputting information from an operator, an output of the trigger circuit and an output of the adding circuit being inputted to a trigger input terminal and a signal input terminal, respectively, of an oscilloscope connected to the oscilloscope operation supporting device so as to be displayed on a screen of the oscilloscope, and a waveform moving means for moving a display time zone of a displayed waveform on the screen of the oscilloscope in response to operation of the operation information inputting means.

The above and other objects, features and advantages of the present invention will become apparent from the following description and the appended claims, taken in conjunction with the accompanying drawings.

BRIEF DESCRIPTION OF THE DRAWINGS

FIGS. 13 and 14 are schematic illustrations showing different indications of the oscilloscope operation supporting device shown in FIG. 10;

FIG. 20 is a schematic illustration showing an indication of the oscilloscope operation supporting device shown in FIG. 18;

FIG. 21($a$-$e$) is a waveform diagram illustrating signal waveforms at several components of the oscilloscope operation supporting device shown in FIG. 18;

FIG. 22 is a schematic illustration showing another indication of the oscilloscope operation supporting device shown in FIG. 18;

FIG. 23 is a circuit diagram showing details of a comparator circuit of the oscilloscope operation supporting device shown in FIG. 18;

FIG. 26 is a flow chart illustrating operation of the application shown in FIG. 25;

FIGS. 32, 33, 34 and 35 are schematic illustrations showing different indications on a display unit of the oscilloscope supporting device shown in FIG. 27;

DESCRIPTION OF THE PREFERRED EMBODIMENTS

Figure 1:
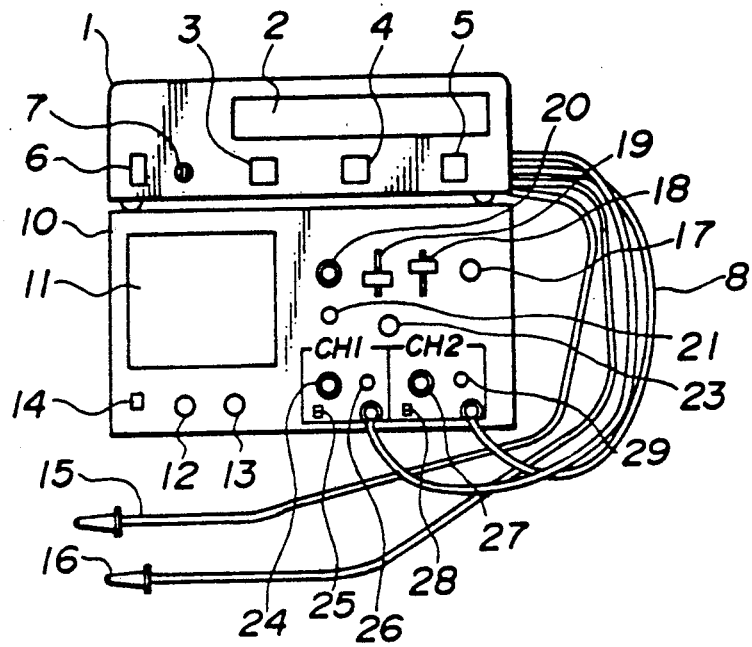
FIG. 1 is a front elevational view of an oscilloscope and an operation supporting device for the same showing a preferred embodiment of the present invention.

Referring first to FIG. 1, there are shown an oscilloscope and an oscilloscope operation supporting device to which the present invention is applied. The oscilloscope operation supporting device is generally denoted at 1 and is used in combination with an oscilloscope on the market such as the oscilloscope 10. The oscilloscope operation supporting device 1 includes an operator guide display unit 2 such as, for example, a CRT (cathode ray tube) display unit or a liquid crystal display device, and a plurality of, four in the embodiment shown, switches including a reset switch 3, a set switch 4 for setting a test number and so on, an OK switch 5 for inputting a response signal to a request indicated on the display unit 2, and a power source switch 6. The oscilloscope operation supporting device 1 further includes a calibrating signal transmitting terminal 7, and a pair of branch signal lines 8 for transmitting a signal to the oscilloscope 10.

The oscilloscope 10 here is of a conventional type which may be suitably used for maintenance and inspection or measurement of an automobile appliance and includes a screen 11, a knob 12 for adjusting a bright line on the screen 11, another knob 13 for adjusting a focus of a bright line on the screen 11, a power source switch 14, a signal probe 15 for a first channel CH1 for transmitting a signal for measurement from an automobile appliance to the oscilloscope 10, a similar signal probe 16 for a second channel CH2, and three knobs for trigger including a trigger level adjusting knob 17 for adjusting a signal indication starting point on the screen 11, another trigger source change-over switch 18 for alternatively selecting an internal trigger source or an external trigger source, and a mode change-over switch 19 for changing over a trigger mode between an automatic mode and a normal mode.

The oscilloscope 10 further includes knobs for a time axis (horizontal axis) including a time axis setting knob 20 and a time axis position adjusting knob 21 for adjusting a position of the time axis.

The oscilloscope 10 further includes a display mode setting switch 23 for selecting a channel indication between the first and second channels CH1 and CH2, a pair of voltage axis (vertical axis) setting knobs 24 and 27, a pair of input coupling system setting knobs 25 and 28 for selecting a coupling system among ac, ground and dc, and a pair of voltage axis position adjusting knobs 26 for adjusting a position of the voltage axis on the screen 11.

Where the oscilloscope 10 can fetch a signal for measurement from an automobile appliance alternatively over the first or second channel CH1 or CH2, the first channel CH1 includes the first channel signal probe 15, voltage axis setting knob 24, input coupling system setting knob 25 and voltage axis position adjusting knob 26. On the other hand, the second channel CH2 includes the second channel signal probe 16, voltage axis position adjusting knob 29, voltage axis setting knob 27 and input coupling system setting knob 29. A channel to be indicated on the screen 11 is selected by means of the display mode setting knob 23.

Figure 2:
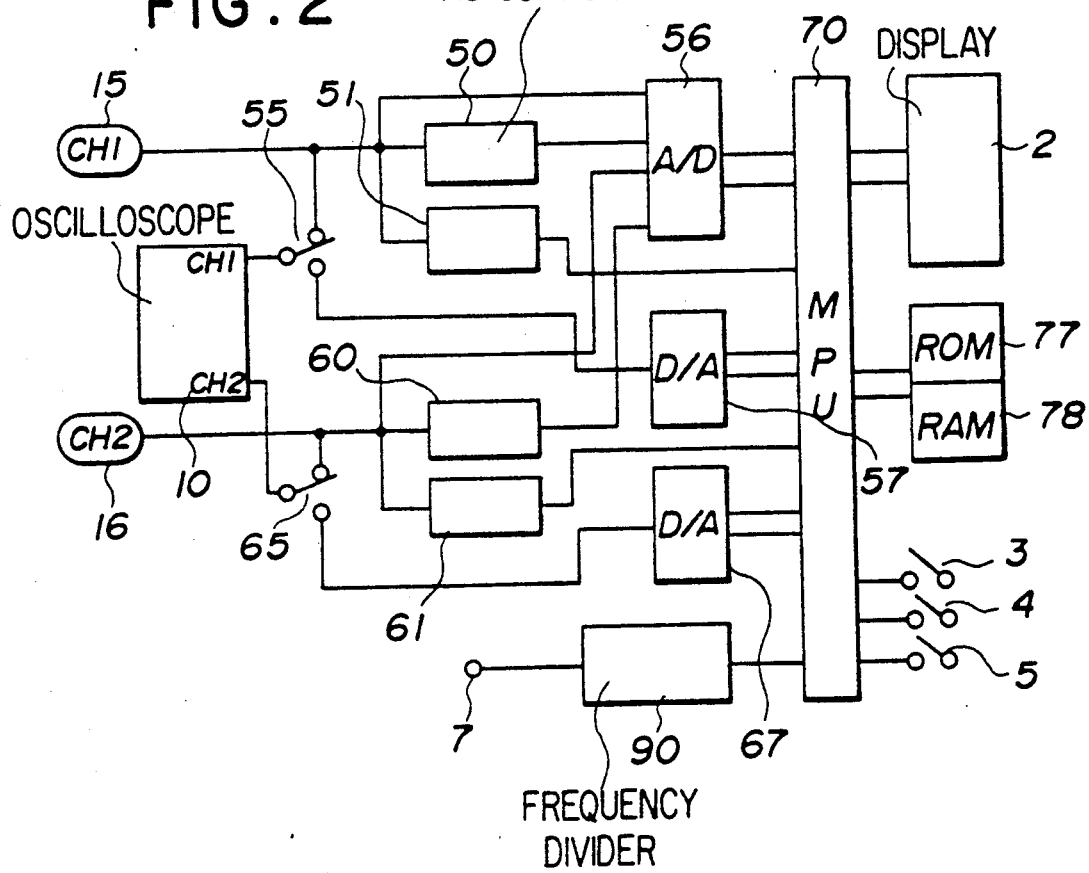
FIG. 2 is a block diagram showing an electric circuit construction of the oscilloscope operation supporting device of FIG. 1.

Subsequently, an electric circuit of the oscilloscope operation supporting device 1 described hereinabove will be described with reference to FIG. 2.

A signal for measurement transmitted via the first channel signal probe 15 is transmitted to a first channel terminal CH1 of the oscilloscope 10 via a switch 55. Such a signal is also received by a peak holding circuit 50, an analog to digital converter 56 and an ac component detecting circuit 51.

An output terminal of the peak holding circuit 50 is connected to an input terminal of the analog to digital converter 56, and an output terminal of the ac component detecting circuit 51 is connected to an input terminal of a microcomputer or MPU (micro processing unit) 70. Output terminals of the analog to digital converter 56 are also connected to other input terminals of the MPU 70. The MPU 70 has a set of output terminals connected to an analog to digital converter 57 which has an output terminal connected to the first channel input terminal CH1 of the oscilloscope 10 via the switch 55. Changing over operation of the switch 55 is controlled by the MPU 70 so that either the digital to analog converter 57 or the first channel signal probe 15 may be alternatively connected to the first channel input terminal CH1 of the oscilloscope 10.

To the contrary, a signal for measurement transmitted via the second channel signal probe 16 is transmitted to a second channel terminal CH2 of the oscilloscope 10 via another switch 65. Such a signal is also received by a peak holding circuit 60, the analog to digital converter 56 and an ac component detecting circuit 61.

An output terminal of the peak holding circuit 60 is connected to another input terminal of the analog to digital converter 56, and an output terminal of the ac component detecting circuit 61 is connected to an input terminal of the MPU 70. The MPU 70 has another set of output terminals connected to an analog to digital converter 67 which has an output terminal connected to the second channel input terminal CH2 of the oscillator 10 via the switch 65. Changing over operation of the switch 65 is also controlled by the MPU 70 so that either the digital to analog converter 67 or the second channel signal probe 16 may be alternatively connected to the second channel input terminal CH2 of the oscilloscope 10.

The MPU 70 is further connected to a ROM (read only memory) 77, a RAM (random access memory) 78, and the operator guide display unit 2 over a data bus. System clock signals delivered from the MPU 70 are transmitted to and divided by a frequency dividing circuit 90, and square waves thus divided by the frequency dividing circuit 90 are outputted from the calibration terminal 7 of the oscilloscope operation supporting device 1. The MPU 70 are also connected to receive signals from the reset switch 3, set switch 4 and OK switch 5.

Operation of the oscilloscope operation supporting device 1 having such a construction as described above will be described below.

In particular, the oscilloscope operation supporting device 1 has the following functions:

(1) Initialization: to give indications of knobs to be operated and a procedure of such operations for initialization of the oscilloscope.
(2) Calibration: to give an indication of a procedure of operations for calibration of the oscilloscope.
(3) Signal measurement: to give indications of contents of operations for measurement of a signal of the oscilloscope and a procedure of such operations.
(4) Data storage: to store input signals in a memory for a specified period of time in order to allow such signals to be displayed on the screen of the oscilloscope when required.

Control flows of the functions are programmed in the ROM 77 in advance. Detailed processing operations of the functions will be described below with reference to FIG. 3.

Figures 3, 4:
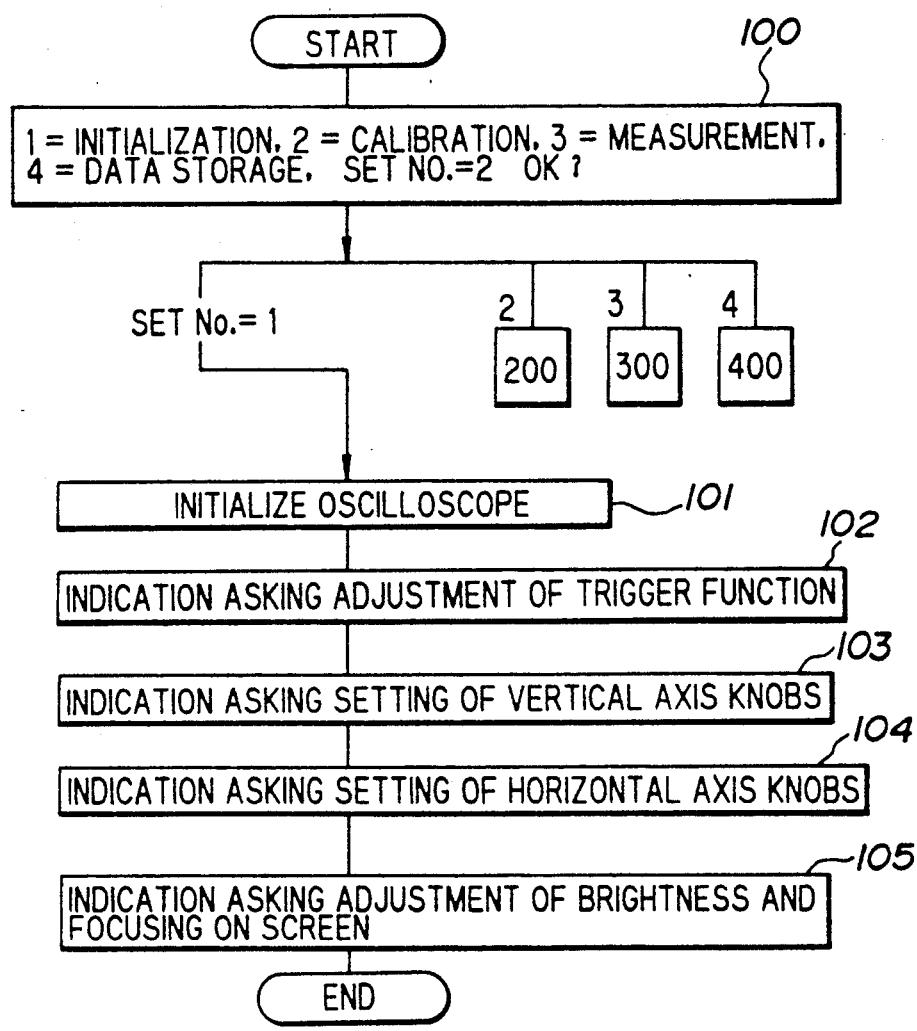
FIG. 3 is a flow chart illustrating general operation of the oscilloscope operation supporting device shown in FIG. 2.
FIG. 4 is a schematic illustration showing an indication of the oscilloscope operation supporting device.

When the power source switch 6 of the oscilloscope operation supporting device 1 shown in FIG. 1 is turned on, execution of the program is started at the MPU 70, and at first, such indications as illustratively shown in a block of step 100 in FIG. 3 are given on the operator guide display unit 2 of the oscilloscope operation supporting device 1. In the example shown, the following indications are given:

SET No. 1 = Initialization
SET No. 2 = Calibration
SET No. 3 = Measurement
SET No. 4 = Data Storage.

An operator can thus select a desired one of the functions given by the indications. In particular, each time the set switch 4 is depressed, the indication of a value following "SET No." is updated, that is, either incremented or decremented, and at the indication of a desired value, the OK switch 5 will be depressed to thus select a desired one of the functions. As a result of such selection, process of the MPU 70 enters a routine of the program for the selected function. In order to facilitate operation for such selection, the display unit 2 may be partially blinked to indicate a switch or switches which need be operated for selecting operation. In particular, the indications of "2" and "OK?" in the display frame at step 100 in FIG. 3 are blinked to inform an operator that the set switch 4 and the OK switch 5 must be depressed. Consequently, the switches can be operated readily without an error.

Subsequently, the function of initialization will be described. When SET No. 1 (initialization) is selected, such an indication as shown in a block at step 101 in FIG. 3 is given on the operator guide display unit 2 for several seconds, and then process advances to step 102 for indication requesting adjustment of trigger functions. At step 2, an indication having contents asking "to set the trigger mode change-over switch 19 to the automatic trigger mode,
the trigger source change-over switch 18 to the internal trigger source, and
the trigger level adjusting switch 17 to the plus trigger"

is given and at the same time the indication of "OK?" is blinked on the operator guide display unit 2. Observing the indications, the operator will operate the oscilloscope 10, and after the required operations are done, the OK switch 5 will be depressed.

Process thus advances to step 103 for indication requesting setting of the vertical axis knobs. In particular, an indication having contents asking "to set the voltage axis setting knob 24 or 27 to a range greater than 0.1 V/DIV.,
the input coupling system setting knob 25 or 28 to the ground, and
the voltage axis position adjusting knob 26 or 29 and display mode setting knob 23 to a CHOP position."

is given and at the same time the indication of "OK?" is blinked on the operator guide display unit 2. The operator will thus make operations as requested and depress the OK switch 5.

Then at step 104, an indication requesting setting of the horizontal axis knobs is given on the operator guide display unit 2. In particular, the indication requests setting of the time axis setting knob 20 and adjustment of the time axis position adjusting knob 21. The operator will thus make operations as requested and depress the OK switch 5.

Subsequently at step 105, an indication requesting adjustment in brightness and focusing on the oscilloscope screen 11 is provided on the display unit 2. The indication may be such, for example, as shown in FIG. 4. In accordance with the indication, the operator will turn on the power source switch 14 and operate, after lapse of a time of interval of about 15 seconds, the brightness adjusting knob 12 and the focusing knob 13. Consequently, a bright line appears on the screen 11.

If such a series of operations for initialization as described above proceeds properly, then a bright line appears on the screen 11 of the oscilloscope 10 in this manner. On the contrary, if any of the switches or knobs is not operated properly, a bright line will not appear properly on the screen 11 of the oscilloscope 10. While it is essential at first to assure appearance of a bright line for the object of proper use of the oscilloscope 10, operations of the oscilloscope 10 necessary for the same are not easy to an unskilled operator without an operational guide.

Figures 5, 6:
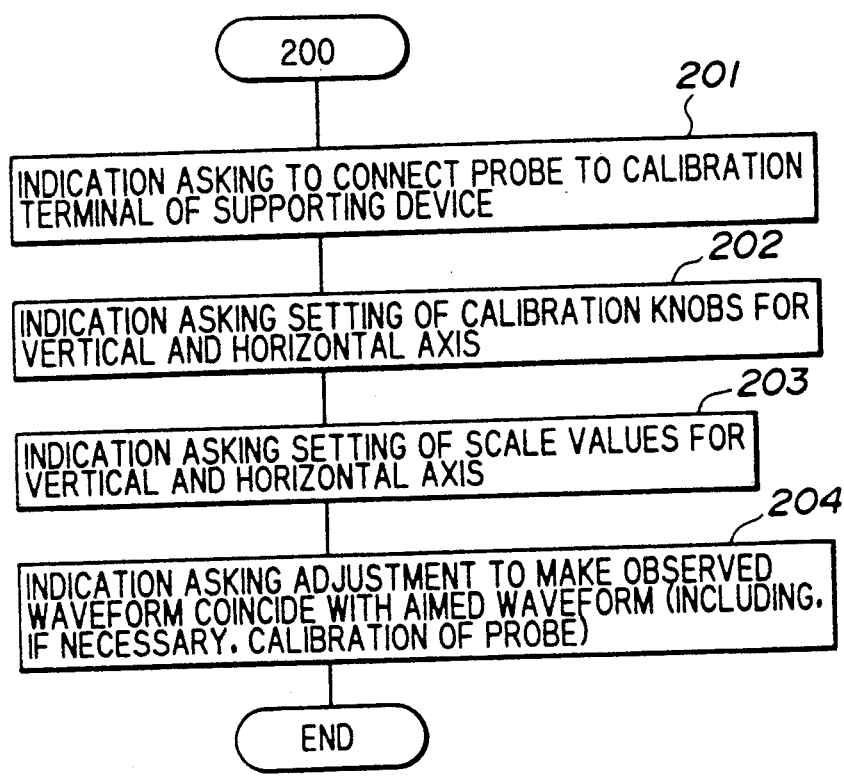
FIG. 5 is a flow chart illustrating calibrating operation of the oscilloscope operation supporting device shown in FIG. 2.
FIG. 6 is a schematic illustration showing an indication of the oscilloscope operation supporting device shown in FIG. 2 during calibrating operation illustrated in FIG. 5.

In case "Calibration" is selected at step 100 in FIG. 3, process advances to a routine 200 which is illustrated in detail in FIG. 5. Referring now to FIG. 5, at first at step 201, an indication requesting connection of a probe to the calibration terminal 7 of the oscilloscope operation supporting device 1 is given on the operator guide display unit 2. Pulses of a square waveform of 15 volts, 100 Hz which are a signal similar to a signal to be outputted from an automobile appliance are outputted at the calibrating terminal 7. The operator will thus operate in accordance with the indication and then depress the OK switch 5 similarly as in the series of operations for initialization described hereinabove. Process thus advances to step 202.

At step 202, an indication of operations of the calibration knobs for the voltage and time axes is given on the operator guide display unit 2. Then at subsequent step 203, an indication requesting setting of scale values for the vertical and horizontal axes and so on. The indication may be such as shown in FIG. 6. In particular, an indication asking "to set the input coupling system setting knob 25 or 28 to DC, the voltage axis setting knob 24 or 27 to the range of 0.5 VOLTS/DIV., the time axis setting knob 20 to a range of 10 milliseconds/DIV., and variable knobs of the knobs 20 and 24 or 27 to a calibration (CAL) position."

is provided.

Subsequently at step 204, an indication asking setting of a waveform observed on the screen 11 of the oscilloscope 10 to a specified aimed value is made.

By such a series of operations as decribed above, the waveform of an input signal observed on the oscilloscope 10 is calibrated properly.

Figures 7, 8:
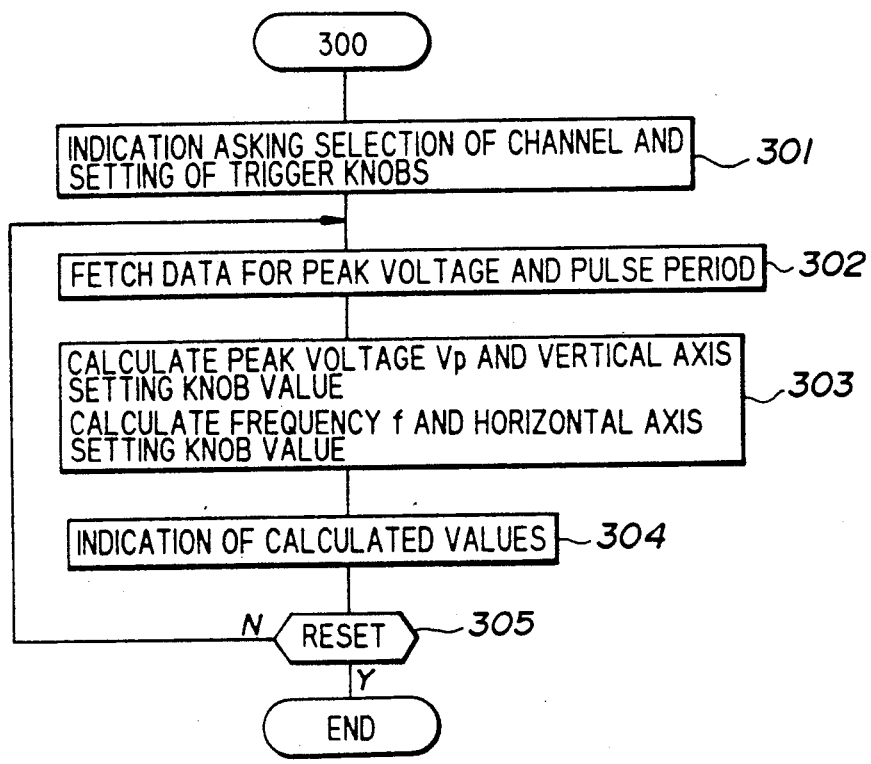
FIG. 7 is a flow chart illustrating measuring operation of the oscilloscope operation supporting device shown in FIG. 2.
FIG. 8 is a schematic illustration showing an indication of the oscilloscope operation supporting device shown in FIG. 2 during measuring operation illustrated in FIG. 7.

To the contrary, in case "SET No.=3" is selected at step 100 shown in FIG. 3, a routine 300 shown in FIG. 7 for signal measuring process is entered. Referring to FIG. 7, at first at step 301, an indication requesting selection of a data channel and setting of the trigger knobs is made and preparations are made for the operations. The MPU 70 instructs the peak holding circuit 50 to hold a peak value of an input signal received via the first channel signal probe 15 shown in FIG. 2 and fetches a data of the peak by way of the analog to digital converting circuit 56. The MPU 70 further fetches the input signal converted into a pulse signal by the ac current detecting circuit 51 and detects a cycle of the pulses. This process is similar for the second channel CH2. Then at step 303, a peak value Vp, a vertical axis setting knob value, a frequency value f and a horizontal axis setting knob value are calculated in accordance with the values fetched at step 302, and then at step 304, they are indicated on the display unit 2. Subsequently at step 305, it is judged whether the reset switch 3 is depressed or not. In case the reset switch 3 is depressed, process comes to an end, but on the contrary in case the reset switch 3 is not depressed, process returns to step 302 in order to repeat the sequence of steps 302 to 304 described above. FIG. 8 illustrates an exemplary indication of the display unit 2 at step 304.

Figure 9:
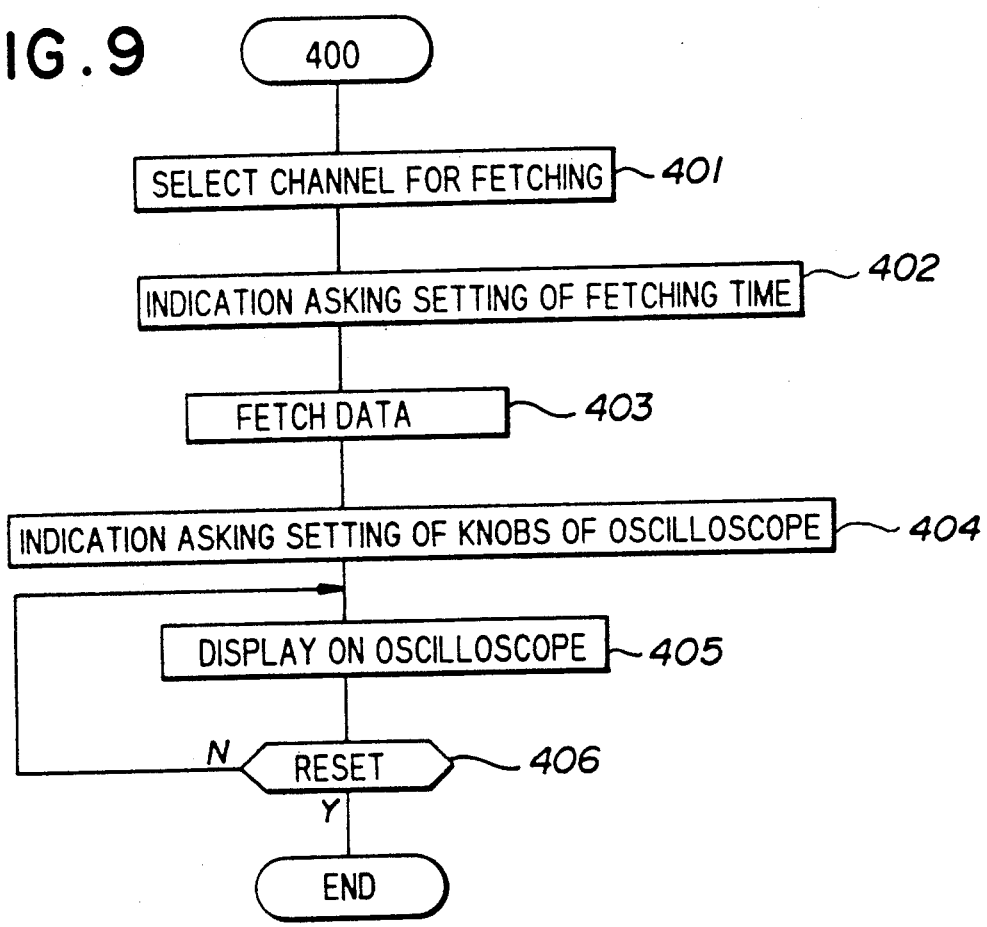
FIG. 9 is a flow chart illustrating data storing operation of the oscilloscope operation supporting device shown in FIG. 2.

On the other hand, in case "SET No.=4" is selected at step 100 shown in FIG. 3, a routine 400 shown in FIG. 9 for data storage process is entered. Referring to FIG. 9, at first at step 401, an indication requesting selection of one of the first and second channels is given on the display unit 2. After the first or second channel is thus selected, an indication asking to determine a data fetching time is made at step 402. After a data fetching time is thus determined, the oscilloscope operation supporting device 1 will be started. Consequently, the MPU 70 stores, at step 403, data (a signal received via the first or second channel CH1 or CH2 by way of the analog to digital converter 56) into the RAM 78 for the period of time set at step 402. After lapse of the set period of time, that is, the data fetching time, an indication asking to set the time axis setting knob 20, voltage axis setting knob 24 or 27 and so on is made at step 404 in accordance with the data thus stored.

Subsequently, the switch 55 or 65 will be changed over. The data stored in the RAM 78 is thus introduced, at step 405, to the oscilloscope 10 via the digital to analog converter 57 or 67 so that they may be indicated on the screen 11 of the oscilloscope 10. The indication is maintained until the reset switch 3 is depressed.

With the oscilloscope operation supporting device 1 of the embodiment described above, for initialization, the several knobs of the oscilloscope can be operated correctly in proper order, which is particularly effective with an operator unfamiliar with such an oscilloscope.

As far as calibration is concerned, since the knobs of the oscilloscope are already set in position in accordance with the individual preset values for signal measurement after such calibrating operation, a signal of an automobile appliance or the like can thereafter be measured correctly with the oscilloscope. Accordingly, the oscilloscope operation supporting device 1 is very effective with an operator unfamiliar with such an oscilloscope.

For signal measurement, an indication of vertical and horizontal axis graduation setting knob values is made. Accordingly, measurement of a signal can be effected rapidly and correctly, and even an amateur can use the oscilloscope.

Due to storage of data, a waveform displayed on the oscilloscope can be retained, which is very effective for analysis of data when a trouble takes place.

Figure 10:
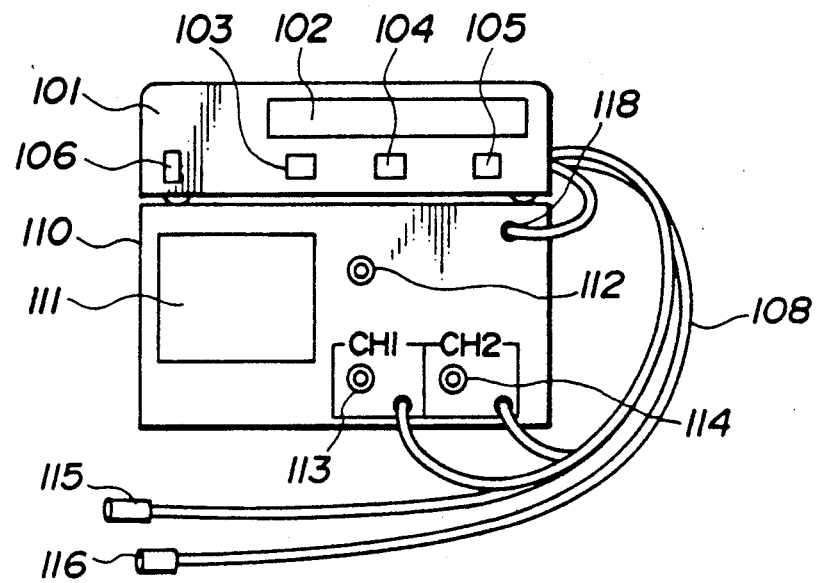
FIG. 10 is a front elevational view of an oscilloscope and an operation supporting device for the same showing another preferred embodiment of the present invention.

Referring now to FIG. 10, there are shown an oscilloscope and an oscilloscope operation supporting device according to a second embodiment of the present invention. Also the oscilloscope operation supporting device 101 is used in combination with the oscilloscope 110. The oscilloscope operation supporting device 101 includes an operator guide display unit 102 such as, for example, a CRT display unit or a liquid crystal display device for displaying characters indicative of operational guide information, and a set of switches including a reset switch 103, a set switch 104 for setting a test number and so on, an OK switch 105 for inputting a response signal to a request indicated on the display unit 102, and a power source switch 106. The oscilloscope operation supporting device 101 further includes a pair of branch signal lines 108 for transmitting a signal for measurement from a signal retrieving probe 115 or 116 also to the oscilloscope operation supporting device 101.

The oscilloscope 110 here is of a conventional type which may be suitably used for maintenance and inspection or measurement of an automobile appliance and includes a screen 111, a horizontal axis setting knob 112 for setting a time value of a signal to be indicated on the screen 111, a pair of vertical axis setting knobs 113 and 114 for setting voltage values of waveforms for two channels to be indicated on the screen 111. The signal retrieving probes 115 and 116 are connected to the oscilloscope 110 for introducing a signal for measurement from an automobile appliance into the oscilloscope 110. The oscilloscope 110 further has an external trigger signal input terminal 118 at which it receives a trigger signal from the oscilloscope operation supporting device 101.

Figure 11:
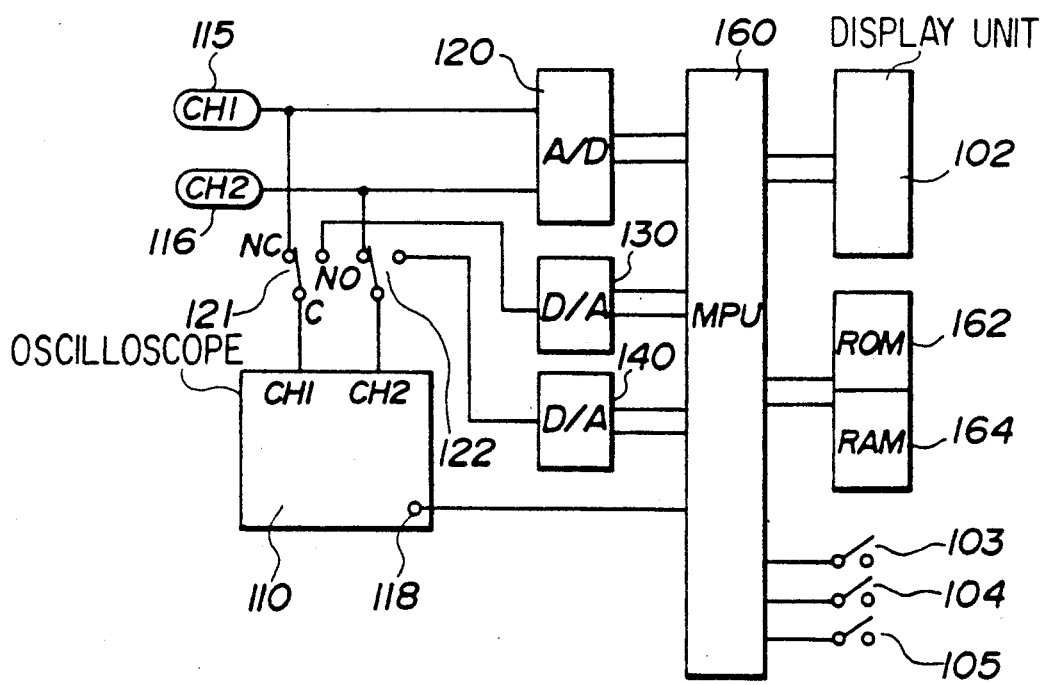
FIG. 11 is a block diagram showing an electric circuit of the oscilloscope operation supporting device of FIG. 10.

Subsequently, an electric circuit of the oscilloscope operation supporting device 101 described above will be described with reference to FIG. 11. The probe 115 for a first channel CH1 is connected to an analog to digital converter 120 and a normally closed contact NC of a signal change-over switch 121. An output terminal of a digital to analog converter 130 is connected to another normally open contact NO of the signal change-over switch 121. The signal change-over switch 121 is controlled by a microcomputer or MPU 160 so that either a signal from the first channel probe 115 or a signal from the digital to analog converter 130 may be received at a further common contact C of the signal change-over switch 121 which is connected to an input terminal CH1 of the oscilloscope 110 for the first channel CH1.

The probe 116 for a second channel CH2 is connected to the analog to digital converter 120 and another signal change-over switch 122 in a similar manner as the probe 115 for the first channel CH1. An output terminal of another digital to analog converter 140 is connected to a normally open contact NO of the signal change-over switch 122. The signal change-over switch 122 is also controlled by the MPU 160.

The MPU 160 delivers a digital signal to the digital to analog converters 130 and 140 over a data bus. The MPU 160 is further connected to the operator guide display unit 102, reset switch 103, set switch 104 and OK switch 105 and also to a ROM 162 and a RAM 164 and operate to make various controlling operations.

Controlling operation of the oscilloscope operation supporting device 101 having such a construction as described above will be described below with reference to a flow chart of FIG. 12.

At first at step S1, the MPU 160 develops an instruction to make an indication to ask an operator if data should be fetched from the first channel CH1 or the second channel CH2 or else from both of the first and second channels CH1 and CH2. After the selection is completed, an indication is made, at step S2, to ask setting or selection of a data fetching time. FIG. 13 illustrates an exemplary indication on the display unit 102 asking setting of a data fetching time. In the example shown, up to five options of data setting time are provided including 1=10 milliseconds, 2=0.1 milliseconds, 3=1 second, 4=10 seconds, and 5=100 seconds, and one of the options is selected arbitrarily by operation of the set switch 104. In particular, each time the set switch 104 is depressed, the indication of a numeral following the indication of "SET No." is successively changed, that is, either incremented or decremented, and if the OK switch 105 is depressed when the indication coincides with the index of a desired data fetching time, then the data setting time is set and registered in the MPU 160. Then at step S3, it is judged whether the OP switch 105 is depressed.

Subsequently at step S4, the channel selected at step S1 is selected as an input to the analog to digital converter 120, and then at step S5, fetching of data or a signal for measurement into the MPU 160 from an automobile appliance is started, whereafter the data thus fetched are stored to predetermined addresses of the RAM 164. At subsequent step S7, it is judged whether or not the data fetching time has elapsed. Accordingly, the steps S4 to S7 are repeated until the preset data fetching time elapses, and during each cycle, a data fetched is stored in sequence into the RAM 164.

At step S8 after the data fetching time has elapsed, a maximum value among the data stored in the RAM 164 is determined and a maximum vertical axis (voltage axis) setting knob value which may not protrude from the area of the screen 111 of the oscilloscope 110 is selectively determined. Then at step S9, the maximum vertical axis setting knob value thus determined is indicated on the display unit 102 together with some other indications so as to ask an operator to operate the oscilloscope 110 in accordance with the indications.

FIG. 14 illustrates an example of the indication. In the example shown, the indications asks an operator to select an external (EXT) trigger, to set the horizontal or time axis setting knob 112 and the vertical or voltage axis setting knob 113 to positions of indicated values and to select a kind of data of the horizontal axis for a waveform re-indicated on the display unit 102. Where an external trigger is selected, the oscilloscope can make an indication from an initial value which is not enabled by a normal trigger when a differential coefficient of the initial value of the stored data is not steep.

When the operator depresses the OK switch 105 at a final stage of step S9, the sequence advances to step S10 at which a single trigger signal is outputted to the external trigger signal input terminal 118 of the oscilloscope 110. Then at step S11, the data stored in the RAM 164 are converted with a scale of the voltage axis setting knob value calculated at step S8 and outputted to the digital to analog converter 130. In this instance, the signal change-over switch 121 is controlled to a position in which the contacts C and NO are connected to each other.

Subsequently at step S12, a total number of the data stored in the RAM 164 is found out, and outputting at S11 is repeated until it is completed for the total number. Finally at step S13, it is judged whether the reset switch 103 is depressed or not, and the steps S10 to S12 are thus repeated until the reset switch 103 is depressed.

During processing at step S11, data outputted from the oscilloscope operation supporting device 101 are continuously indicated on the screen 111 of the oscilloscope 110, and readings of the voltage or vertical axis and the time or horizontal axis are confirmed by means of the operator guide display unit 102. In this instance, the maximum set time is 100 seconds, but a time required for re-indication of the data can be reduced to several tens milliseconds or so. Accordingly, the oscilloscope operation supporting device 101 is particularly effective for re-indication for a long time which may not be observed well on the oscilloscope 110 or the like.

Figure 15:
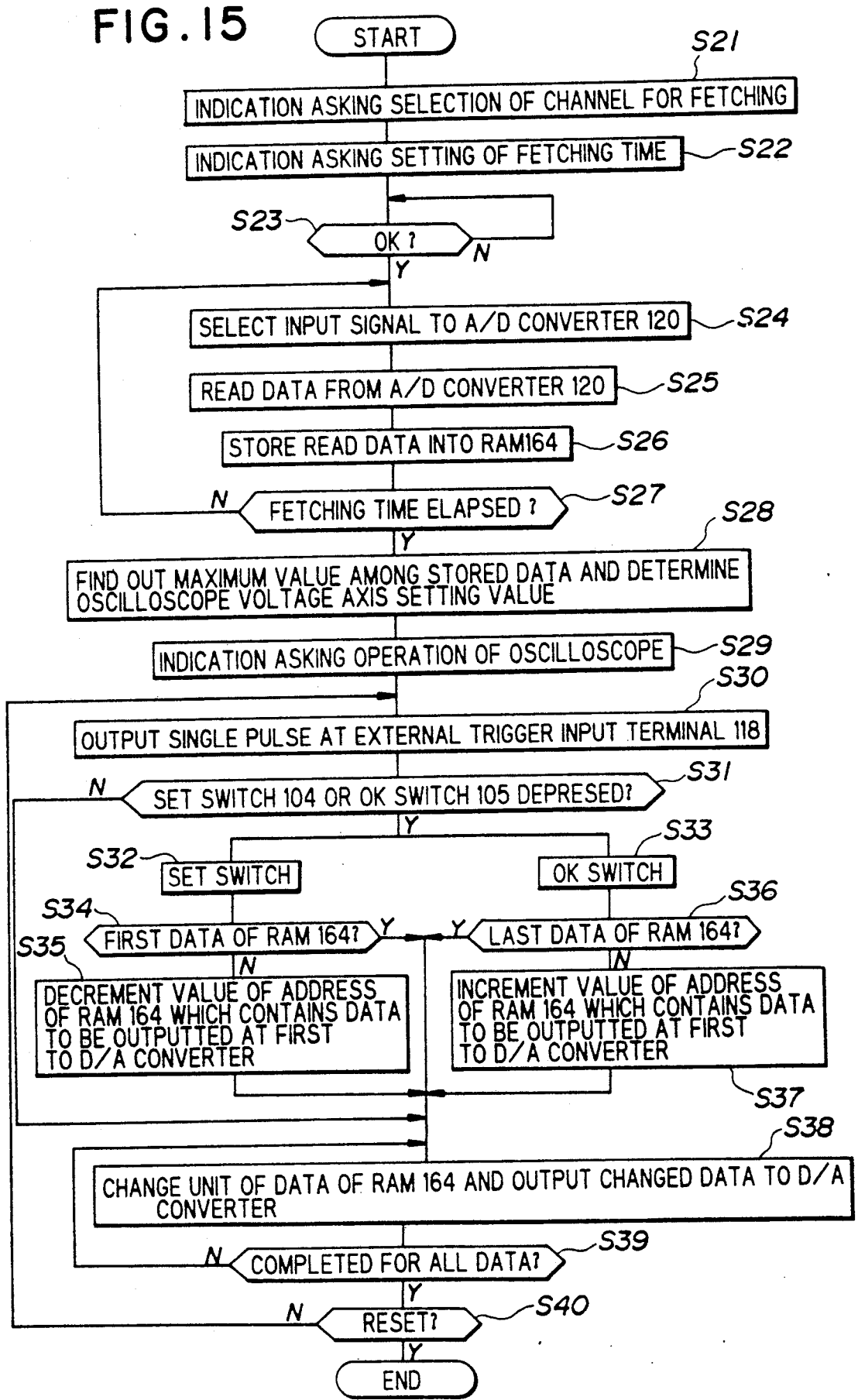
FIG. 15 is a flow chart illustrating modified operation of the oscilloscope operation supporting device shown in FIG. 10.

FIG. 15 shows a flow chart illustrating a modified controlling operation of the oscilloscope operation supporting device 101. In this instance, the oscilloscope operation supporting device 101 has an additional function to shift a waveform displayed on the screen 111 of the oscilloscope 110 leftwardly or rightwardly.

In the flow chart shown in FIG. 15, contents of steps S21 to S30 are quite same as those of steps S1 to S10 described hereinabove with reference to FIG. 12, and accordingly, description thereof will be omitted herein to avoid redundancy.

At step S31, it is judged whether or not the set switch 104 or the OK switch 105 is depressed, and in case the set switch 104 is depressed, process advances to step S32, but if the OK switch 105 is depressed, process advances to step S33. In particular, if an indication is made that a waveform re-indicated on the screen 111 of the oscilloscope 110 will be shifted leftwardly if the set switch 104 is depressed but shifted rightwardly if the OK switch 105 is depressed, then an operator will operate either the set switch 104 or the OK switch 105 to obtain a delayed indication of the waveform on the screen 111.

If process advances to step S32, it is judged at step S34 whether or not a data to be delivered to the digital to analog converter 130 is the first data stored in the RAM 164. In case the judgment is "YES", the process after then is similar to that shown in FIG. 12 because the waveform cannot be shifted leftwardly any more. On the contrary in case the judgment at step S34 is "NO", process advances to step S35 at which the address of the RAM 164 from which a data is to be outputted at first to the digital to analog converter 130 or 140 is decremented by one.

To the contrary, if process advances to step S33, it is judged at step S36 whether or not a data which is to pass the digital to analog converter 130 or 140 at first is the last data stored in the RAM 164. In case the judgment is "YES", the process after then is similar to that shown in FIG. 12 because the waveform cannot be shifted rightwardly any more. On the contrary in case the judgment is "NO", process advances to step S37 at which the address of the RAM 164 from which a data is to be outputted at first to the digital to analog converter 130 or 140 is incremented by one.

Figure 12:
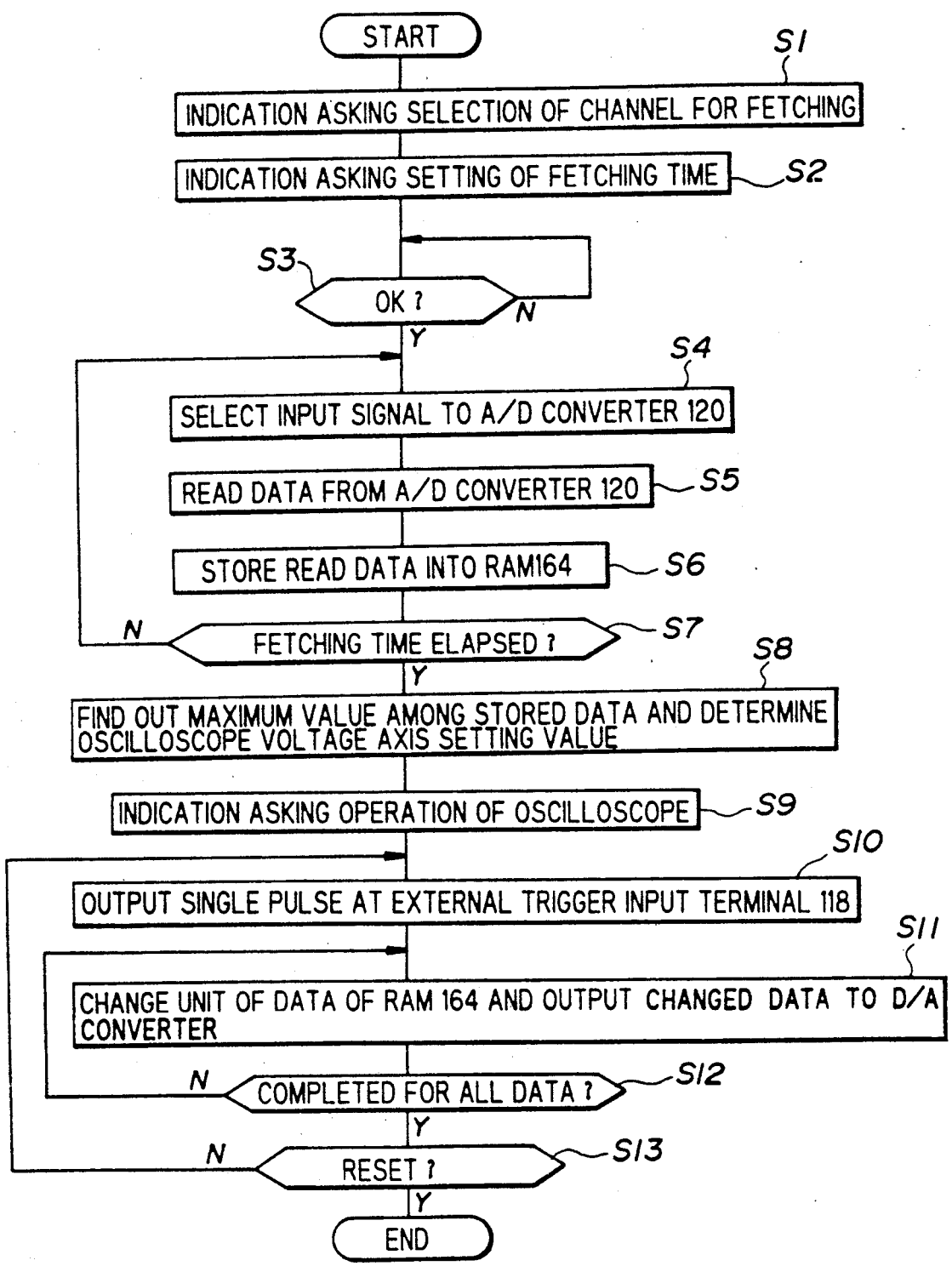
FIG. 12 is a flow chart illustrating operation of the oscilloscope operation supporting device shown in FIG. 10.

Contents of steps S38, S39 and S40 after then are quite similar to those of steps S11, S12 and S13, respectively, shown in FIG. 12, and accordingly, description thereof will be omitted herein to avoid redundancy.

With the modified operation, if the set switch 104 is held depressed, a reproduced waveform indicated on the screen 111 of the oscillator 110 is automatically and successively shifted leftwardly. To the contrary, if the OK switch 105 is held depressed, a reproduced waveform is automatically and successively shifted rightwardly. Further, an absolute voltage value of a data to be delivered at first to the digital to analog converter 130 or 140 and a time of delay of the data from a data fetched at first at step S25 may be indicated on the display unit 102.

Figure 16:
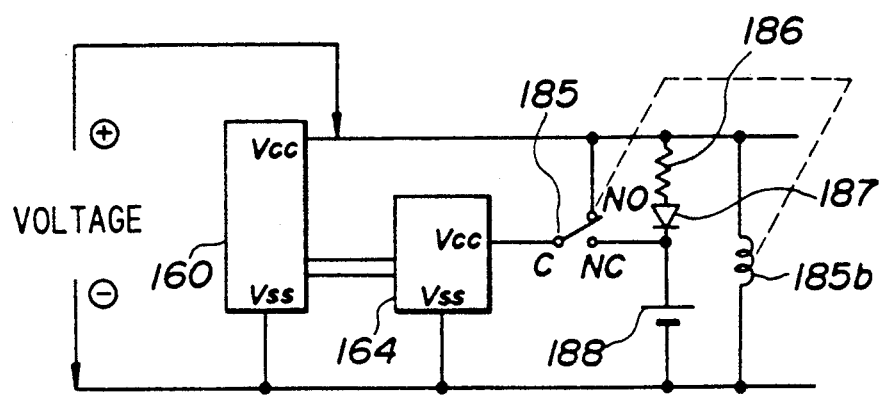
FIG. 16 is a block diagram of an oscilloscope operation supporting device showing a further embodiment of the present invention.

Referring now to FIG. 16, there is shown a circuit construction of an oscilloscope operation supporting device according to a further embodiment of the present invention. The oscilloscope operation supporting device of the present invention is designed such that data stored in a RAM can be retained for a long period of time.

The oscilloscope operation supporting device shown includes an MPU 160 which is of the CMOS type and receives supply of power between a pair of terminals Vcc and Vss thereof over power supply lines from a power source. A coil 185b of a relay 185 and a series circuit including a resistor 186, a diode 187 and a chargeable battery 188 are interposed in the power supply line. The relay 185 includes three contacts 185a including a normally open contact NO connected to the positive side of the power source, a normally closed contact NC connected to the positive side of the battery 188, and a common contact C connected to a terminal Vcc of the RAM 164.

When power is supplied, the common contact C and the normally open contact NO of the relay 185a are connected so that the power is supplied directly to the terminal Vcc of the RAM 164. In this instance, the battery 188 is charged by way of the resistor 186 and diode 187. To the contrary, if power is interrupted, for example, due to service interruption, the common terminal C of the relay 185a is connected to the normally open contact NO so that the power is now supplied from the battery 188 to the RAM 164. Accordingly, data stored in the RAM 164 can be retained for a long period of time.

With the oscilloscope operation supporting device having such a construction as described above, storage and re-indication of data of measurement can be made by a combination of the oscilloscope operation supporting device with an oscilloscope. For example, when data for a maximum period of time of 100 seconds are fetched and re-indicated on an oscilloscope, they can be indicated repetitively in a very short period of time. Accordingly, the oscilloscope operation supporting device is particularly effective for observation of a waveform which varies over such a long period of time that it cannot readily be confirmed on an oscilloscope and is thus effective for discovery of an abnormal signal when an abnormal condition occurs at an appliance to be measured.

Figure 17:
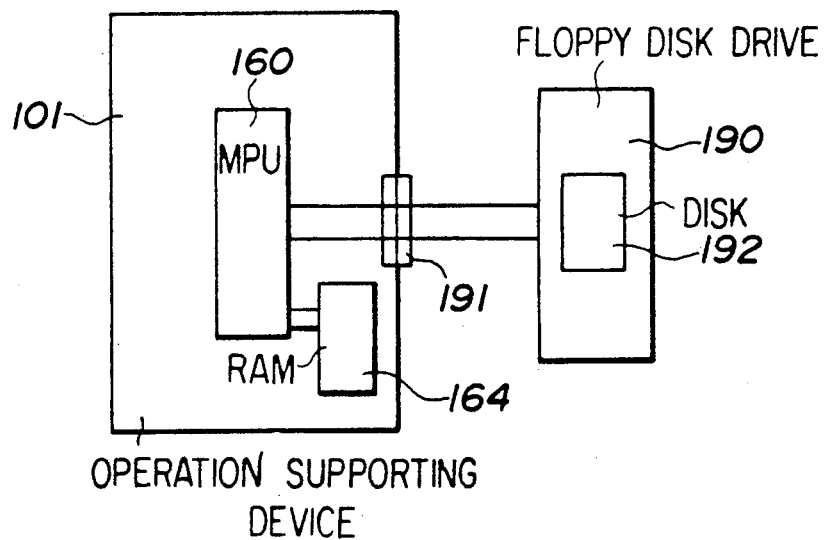
FIG. 17 is a block diagram of an oscilloscope operation supporting device showing a still further embodiment of the present invention.

FIG. 17 shows an electric circuit of an oscilloscope operation supporting device according to a still further embodiment of the present invention. Also with the oscilloscope operation supporting device, data stored in a RAM 164 can be retained permanently.

In particular, an MPU 160 of the oscilloscope operation supporting device is connected to a permanent memory such as, for example, a floppy disk drive unit 190 via a connector 191. Accordingly, data stored in the RAM 164 of the MPU 160 can be permanently stored by recording the same to a disk-shaped record medium 192 by means of the floppy disk drive unit 190. The floppy disk drive unit 190 may be replaced, for example, by a controlling device such as, for example, a personal computer.

The oscilloscope operation supporting device of the embodiment described above thus enables permanent storage of data. Accordingly, where an appliance to be measured is an automobile appliance, the oscilloscope operation supporting device is very effective when an actual test of an automobile is conducted and results of the test are stored and then the results are carried back to a factory and reproduced there or the results are explained to a customer later. Further, accumulation and processing of data are enabled.

Figure 18:
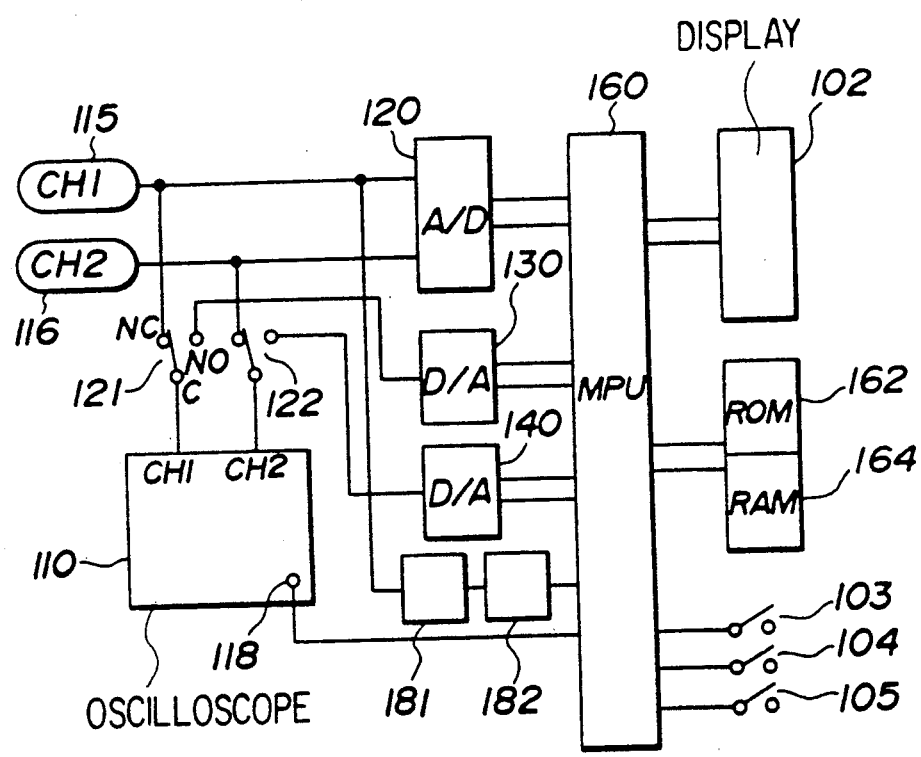
FIG. 18 is a block diagram of an oscilloscope operation supporting device showing a yet further embodiment of the present invention.

FIG. 18 shows an electric circuit of an oscilloscope operation supporting device according to a yet further embodiment of the present invention. The electric circuit shown is similar in construction to the electric circuit shown in FIG. 11 except that a signal from a signal probe 115 for a first channel CH1 is transmitted to a microcomputer or MPU 160 by way of a differentiator circuit 181 for detecting a rate of variation of an input signal from the first channel CH1 with respect to time and a comparator circuit 182 for converting the thus detected rate of variation into a pulse signal.

Controlling operation of the oscilloscope operation supporting device will be described below with reference to a flow chart shown in FIG. 19.

After starting of the MPU 160, it develops, at step S1, an instruction to make an indication to ask an operator whether data should be fetched from the first channel CH1 or the second channel CH2 or else from both of the first and second channels CH1 and CH2. After the selection of a channel is completed, an indication is made, at step S2, to ask setting or selection of a data fetching time.

FIG. 20 illustrates an exemplary indication on the operator guide display unit 102 asking setting of a data fetching time. In the example shown, up to five options of data setting time are provided including 1=10 milliseconds, 2=0.1 second, 3=1 second, 4=10 seconds, and 5=100 seconds, and one of the options is selected arbitrarily by operation of the set switch 104 described hereinabove. The data fetching time may be set to a sweep time value of a time axis setting knob value of the oscilloscope 101. Each time the set switch 104 is depressed, the indication of a numeral following the indication of "SET No." in FIG. 20 is successively changed, that is, either incremented or decremented, and if the OK switch 105 is depressed when the indication coincides with the index of a desired data fetching time, then the data setting time is set and registered into the MPU 160. At step S3, it is determined in a similar manner whether fetching of data should be effected automatically or manually, and in case manual fetching is selected, fetching of data is started at a point of time when the OK switch 105 is subsequently depressed at step S4.

To the contrary, in case automatic fetching is selected, a point of time when an input signal of the first channel changes is detected and an automatic triggering circuit for starting fetching of data is activated at the point of time as seen in FIG. 21. In particular, at first when such a signal of the first channel as shown in a waveform (a) of FIG. 21 is inputted, the differentiator circuit 181 develops an output which has such a waveform as shown at (b) in FIG. 21. The output signal of the differentiator circuit 181 is shaped by the comparator circuit 182 so that it is converted into a pulse signal as shown by a waveform (c) in FIG. 31. The pulse signal is transmitted to the MPU 160, which thus develops such signal as shown by a waveform (d) in FIG. 31. In this instance, when the comparator circuit 182 detects a rising end of the signal received, the output thereof presents a rise as seen at the waveform (c) in FIG. 21. Such operations as described above are effected at step S5 shown in FIG. 19. After completion of the operations, the MPU 160 starts fetching of data at a rising edge of a subsequent next pulse.

Figure 19:
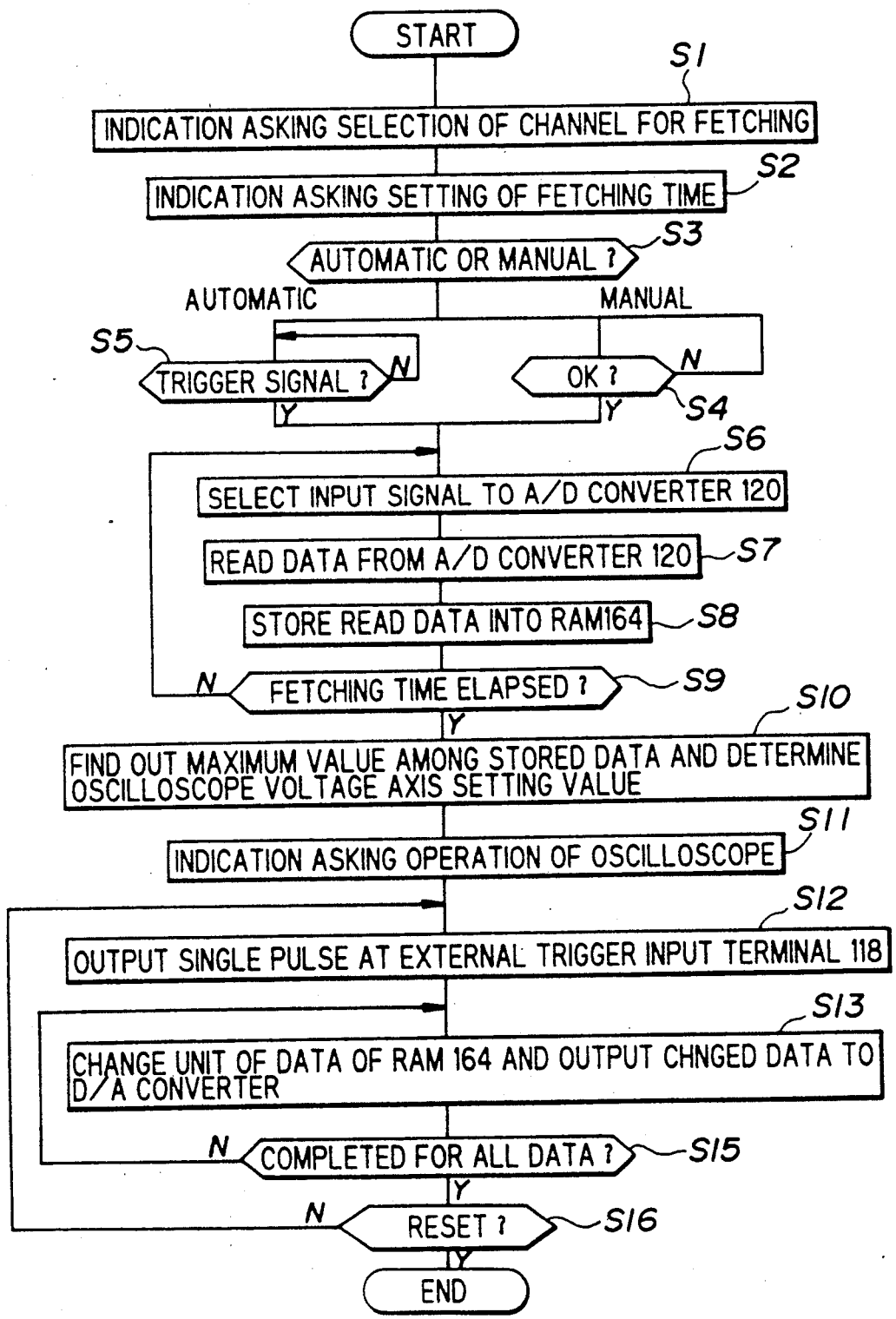
FIG. 19 is a flow chart illustrating operation of the oscilloscope operation supporting device shown in FIG. 18.

In such fetching operation, at first at step S6 shown in FIG. 19, the channel selected at step S1 is selected as an input to the analog to digital converter 120, and then at step S7, an output of the analog to digital converter 120 is fetched.

FIG. 23 shows detailed construction of the comparator circuit 182. The comparator circuit 182 includes a variable resistor 821 for setting a trigger level, a comparator 822, a positive voltage power terminal 823, a negative voltage power terminal 824, and a switch 825 which is controlled by the MPU 160 to selectively connect the variable resistor 821 to the positive or negative voltage power terminal 823 or 824 to supply a positive voltage or a negative voltage to the variable resistor 821. The comparator 822 has a pair of input terminals of which one is connected to receive an output of the variable resistor 821 and the other is connected to receive an output of the differentiator circuit 181.

With the comparator 182 having such a construction as described above, when the switch 825 is connected to the positive voltage power terminal 823, the variable terminal of the variable resistor 821 presents such a reference level as indicated at th+ in the waveform (b) of FIG. 21 so that the comparator 822 presents such an output as shown by the waveform (c) in FIG. 21. On the contrary when the switch 825 is connected to the negative voltage power terminal 824, the variable terminal of the variable resistor 821 presents such a reference level as indicated at th− in the waveform (b) of FIG. 21 so that the comparator 822 presents such an output as shown by another waveform (e) in FIG. 21. The trigger level (reference level) is thus changed by adjusting the variable resistor 821 so that an arbitrary trigger point of a differential coefficient can be outputted as a starting signal.

Referring back to FIG. 19, the data fetched from the analog to digital converter 120 at step S7 is stored into the RAM 164 at step S8, and then at step S9, it is judged whether or not the data fetching time set at step S2 has elapsed. In case the data fetching time has not yet elapsed, process returns to the processing at step S6 so that the steps S6, S7, S8 and S9 may be repeated again. During each cycle of the steps S6 to S9, a data is stored in sequence into the RAM 164.

After the data fetching time has elapsed, process advances to step S10 at which a maximum value among the data stored in the RAM 164 is determined and a maximum voltage axis setting knob value which may not protrude from the area of the screen 111 of the oscilloscope 110 is selectively determined. Then at step S11, the maximum voltage axis setting knob value thus determined is indicated on the display unit 102 together with some other indications so as to ask an operator to operate the oscilloscope 110 in accordance with the indications in order to obtain a proper display on the screen 111 of the oscilloscope 110.

FIG. 22 illustrates an example of such indications. In the example shown, the indications ask an operator to select an external (EXT) trigger, to set the horizontal or time axis setting knob 112 and the vertical or voltage axis setting knob 113 to positions of indicated values and to select a kind of data of the horizontal axis for a waveform re-indicated on the display unit 102. Where an external trigger is selected, the oscilloscope can make a display from an initial value which is not enabled by a normal trigger when a differential coefficient of the initial value of the stored data is not steep.

When the operator subsequently depresses the OK switch 105 at a final stage of step S11, process advances to step S12 at which a single trigger signal is outputted at the external trigger signal input terminal 118 of the oscilloscope 110. Then at step S13, the data stored in the RAM 164 are converted with a scale of the voltage axis setting knob value calculated at step S10 and outputted to the digital to analog converter 130. In this instance, the signal change-over switch 121 is controlled to a position in which the common and normally open contacts are connected to each other. Subsequently at step S15, a total number of the data stored in the RAM 164 is found out, and outputting at S13 is repeated until it is completed for the total number. Finally at step S13, it is judged whether the reset switch 103 is depressed or not, and the steps S10 to S12 are thus repeated until the reset switch 103 is depressed. During processing at step S13, data outputted from the oscilloscope operation supporting device 101 are continuously indicated on the screen 111 of the oscilloscope 110, and readings of the voltage axis and the time axis are confirmed by means of the operator guide display unit 102.

In the oscilloscope operation supporting device 101 described above, while the maximum set time is 100 seconds, a time required for re-indication of the data on the oscilloscope 110 is several tens milliseconds or so. Accordingly, the oscilloscope operation supporting device 101 is particularly effective for re-indication for a long time which may not be observed well on the oscilloscope 110 or the like.

Meanwhile, if an automatic mode is selected, then a signal can be fetched based on automatic trigger starting. Accordingly, the oscilloscope can be handled in a similar manner as in the case when it is operated by a trigger upon measurement.

While the automatic triggering function is attained by means of hardware in the oscilloscope operation supporting device of the embodiment described above, it may otherwise be attained only by means of software. Such a modified controlling operation of the oscilloscope operation supporting device is illustrated in a flow chart of FIG. 24.

Figure 24:
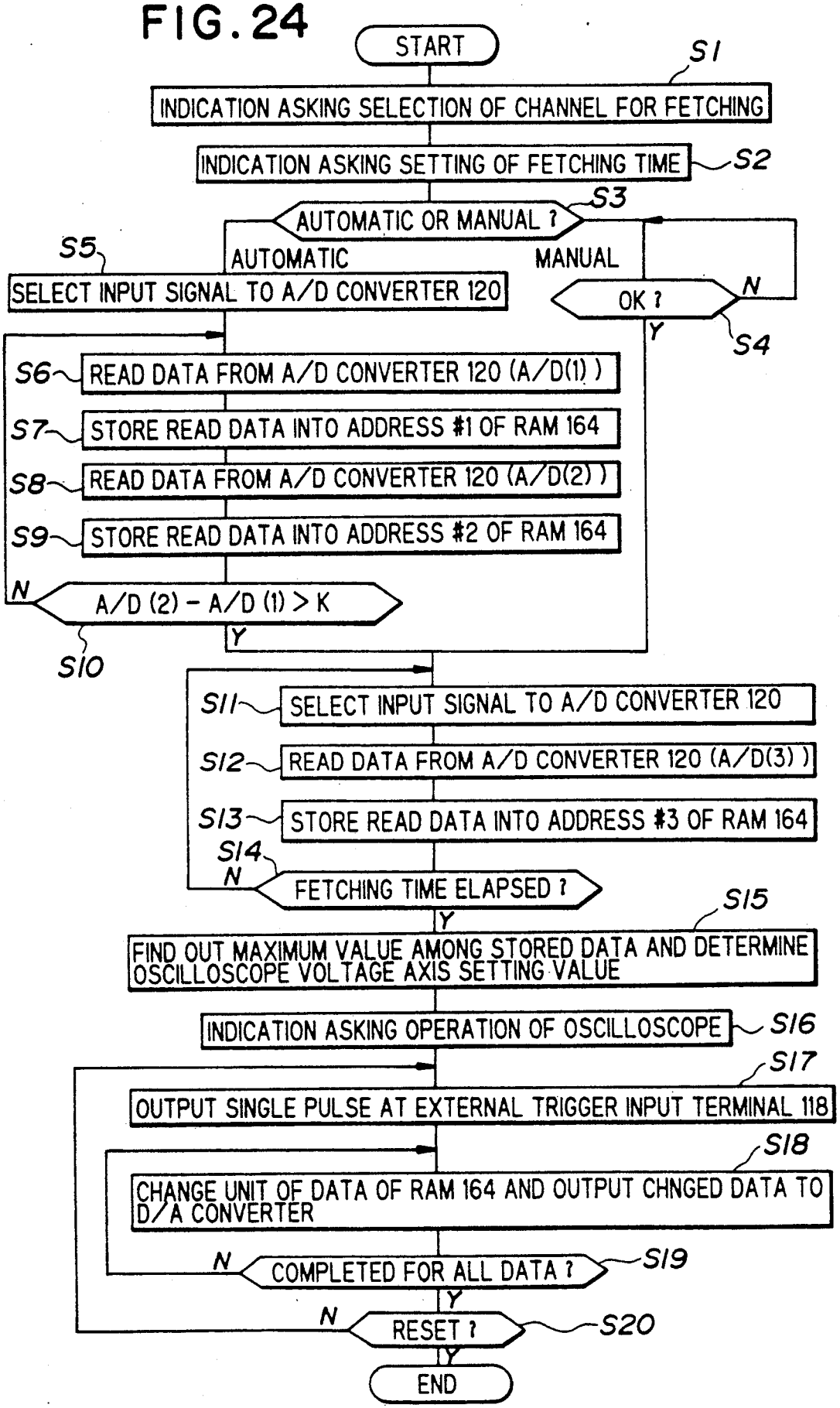
FIG. 24 is a flow chart illustrating modified operation of the oscilloscope operation supporting device shown in FIG. 18.

Referring to FIG. 24, contents of steps S1 to S3 and S14 to S20 in the flow chart shown are quite same as those of steps S1 to S3 and S9 to S16 described hereinabove with reference to FIG. 12, respectively, and accordingly, description thereof will be omitted herein to avoid redundancy.

At step S3 shown in FIG. 24, it is judged whether fetching of data should be effected automatically or manually. In case manual fetch is selected, process advances to step S4 at which fetching of data is started at a point of time when the OK switch 105 is detected. On the contrary in case automatic fetching is judged at step S3, process advances to step S5 at which it is determined that an input to the analog to digital converter 120 should be derived from the channel or channels selected at step S1. Then at step S6, an input signal is read by the analog to digital converter 120, and the input signal thus read is stored into a first address #1 of the RAM 164 at step S7. After then, an input signal is read again by the analog to digital converter 120 at step S8 and stored into a second address #2 of the RAM 164 at step S9. Then at step S10, a rate of variation in voltage between the two values stored at steps S7 and S9 is calculated, and it is judged whether or not the rate is greater than a preset value K which is an arbitrarily set variable value.

In case the result of the judgment at step S10 is "NO", process returns to step S6 so that the sequence of operations from step S6 to step S10 is repeated. To the contrary, when the result of the judgment at step S10 is "YES", process advances to step S11 at which selection of an input signal to the analog to digital converter 120 is performed again. The data fetched at steps S7 and S9 are thus determined as effective, and an input signal is read further at step S12 and stored into an address #3 of the RAM 164 at step S13. Processing after then is similar to that described hereinabove with reference to FIG. 19.

With the processing described above, a sequence of processing operations can be attained even by software based on automatic trigger starting.

With the oscilloscope operation supporting device of the embodiment described above, storage and re-indication of data can be made by a combination of the oscilloscope operation supporting device with an oscilloscope. With the oscilloscope operation supporting device, when data for a maximum period of time of 100 seconds are fetched so as to be re-indicated on an oscilloscope, they can be indicated repetitively in a very short period of time. Accordingly, the oscilloscope operation supporting device is particularly effective for observation of a waveform which varies over such a long period of time that it cannot readily be confirmed on an oscilloscope. Besides, since fetching of data can be started at a point of time of a change by the automatic triggering function, the oscilloscope operation supporting device displays its power for detection of a single shot abnormal signal or the like.

An example of application of the oscilloscope operation supporting device 101 described above will be described below with reference to FIGS. 25 and 26.

Figure 25A:
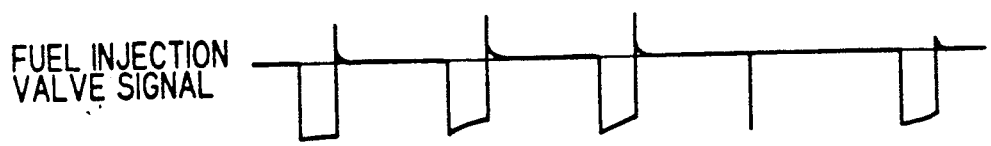
FIG. 25($a$-$c$) a waveform diagram showing waveforms in an application of the oscilloscope operation supporting device shown in FIG. 18.
Figure 25B:
Figure 25C:

Referring first to FIG. 25, a waveform of a controlling signal of a fuel injection valve controlling device for an automobile is shown at (a). Where the oscilloscope operation supporting device 101 receives an input signal having such a waveform as shown at (a), such a trigger signal corresponding to the input signal as shown by another waveform (b) is developed from the oscilloscope operation supporting device 101, and in response to the trigger signal, data are repetitively fetched from the fuel injection valve controlling device at such timings as seen in a waveform (c) in FIG. 25.

Referring now to FIG. 26, a flow chart for such control as described above is shown. The flow chart is basically similar to the flow chart shown in FIG. 19, and at first at step S1, the MPU 160 develops an instruction to make an indication to ask an operator to select a channel from which a data should be fetched. At subsequent step S2, an indication is made to ask setting or selection of a data fetching time, and then at step S3, it is determined whether fetching of data should be effected automatically or manually. In case manual fetching is selected, it is judged at step S4 whether or not the OK switch 105 for fetching of data is depressed.

To the contrary, in case automatic fetching is selected at step S3, it is selected at step S5 whether data fetching should be continuously or repetitively. In case continuous fetching is selected, processing of a trigger signal is executed at step S6. To the contrary, in case repetitive fetching is selected, process advances after a minute repeat cycle time (time t of the waveform (c) in FIG. 25) after generation of trigger signals is determined at step S7.

At step S8 subsequent to step S6, it is determined that input to the analog to digital converter 120 should be taken from the channel selected at step S1. Then at step S9, an input data converted from an analog value into a digital value by the analog to digital converter 120 is fetched, and the input data thus fetched is stored into a predetermined address of the RAM 164 at step S10. Subsequently at step S11, such a determination as made at step S5 is made similarly, and in case continuous fetching is determined, process advances to step S14. To the contrary, in case repetitive fetching is determined at step S11, process advances to step S12 at which it is judged whether or not the repeat cycle time has elapsed. In case the judgment is "NO", process returns to step S8, but on the contrary in case the judgment is "YES", process advances to step S13 at which it is judged whether or not the preset time set at step S2 has elapsed. In case the judgment at step S13 is "NO", process returns to step S6, but on the contrary in case it is "YES", process advances to step S15.

Contents of processing at steps S14 to S20 are quite same as those of processing at steps S9 to S16 of the flow chart shown in FIG. 19, respectively, and overlapping description thereof is omitted herein.

As the procedure described above is executed, characteristics upon repeated transition are stored in memory as reduced successive data which can be used for re-indication.

With the application described above, an oscilloscope waveform which can be observed very readily is obtained against a transition phenomenon which takes place repetitively, which makes the application very effective.

Figure 27:
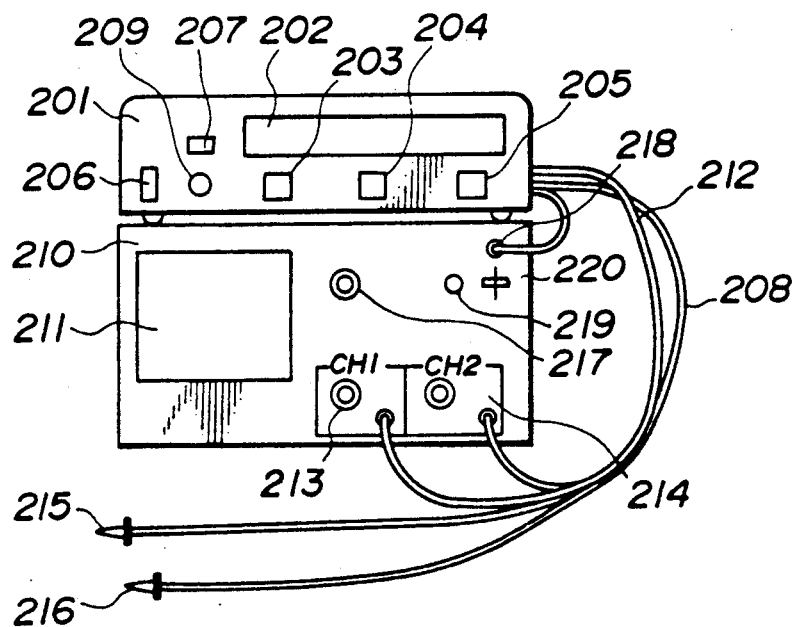
FIG. 27 is a front elevational view of an oscilloscope and an operation supporting device for the same showing a yet further embodiment of the present invention.

Referring now to FIG. 27, there are shown an oscilloscope and an oscilloscope operation supporting device according to a yet further embodiment of the present invention. Also the oscilloscope operation supporting device 201 is used in combination with the oscilloscope 210. The oscilloscope operation supporting device 201 includes an operator guide display unit 202 such as, for example, a CRT display unit or a liquid crystal display device for displaying characters indicative of operational guide information, and a set of switches including a reset switch 203, a set switch 204 for setting a test number and so on, an OK switch 205 for entering a response signal to an instruction indicated on the display unit 202, and a power source switch 206. The oscilloscope operation supporting device 201 further includes a pair of trigger knobs including a polarity changing over switch 207 for selectively setting a positive or negative polarity for a trigger signal and a level adjusting knob 209 for adjusting a trigger level. The oscilloscope operation supporting device 201 further includes a pair of branch signal lines 208 for transmitting a signal for measurement from a signal retrieving probe 215 or 216 also to the oscilloscope operation supporting device 201.

The oscilloscope 210 here is of a conventional type which may be suitably used for maintenance and inspection or measurement of an automobile appliance and includes a screen 211, a horizontal axis setting knob 212 for setting a time value of a signal to be indicated on the screen 211, a pair of vertical axis setting knobs 213 and 214 for setting voltage values of waveforms for two channels to be indicated on the screen 211. The signal retrieving probes 215 and 216 are connected to the oscilloscope 210 for introducing a signal for measurement from an automobile appliance into the oscilloscope 210. The oscilloscope 210 further has a knob 217 for setting a time or horizontal axis, and an external (EXT) trigger signal input terminal 218 at which it receives a trigger signal from the oscilloscope operation supporting device 201. The oscilloscope 210 further includes a trigger adjusting knob 219 for adjusting a trigger level, and a trigger source selecting knob 220 for alternatively selecting an internal signal or an external signal as a source of a trigger signal.

Figure 28:
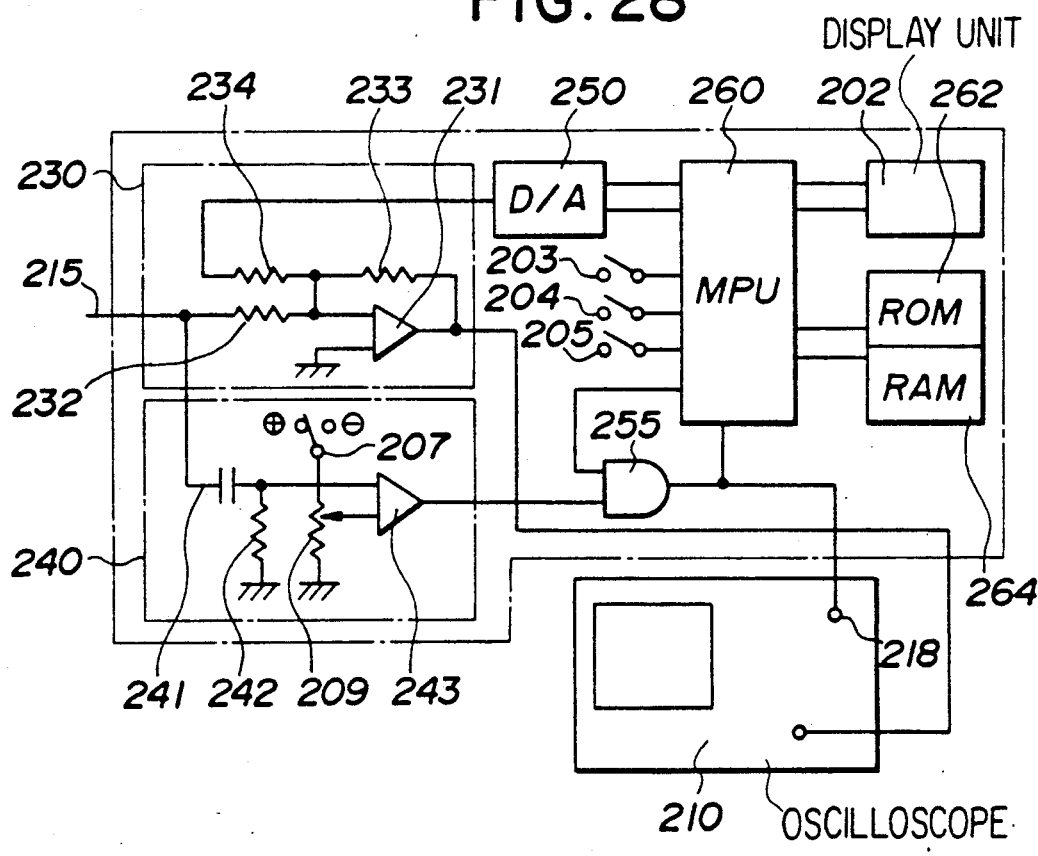
FIG. 28 is a block diagram showing an electric circuit of the oscilloscope operation supporting device shown in FIG. 27.

Subsequently, an electric circuit of the oscilloscope operation supporting device 201 described above will be described with reference to FIG. 28. The probe 115, for example, for a first channel CH1 is connected to an adding circuit 230 and a trigger circuit 240.

The adding circuit 230 includes three resistors 232, 233 and 234 and an operational amplifier 231 and acts to add inputs to the resistors 234 and 232 and deliver the result of the addition as an output thereof. The adding circuit 230 is connected to receive a signal from the probe 215 at the resistor 232 and has an output terminal connected to an input terminal of the oscilloscope 210.

The trigger circuit 240 includes a differentiator circuit composed of a capacitor 241 and a resistor 242, another circuit composed of the polarity changing over switch 207 and the trigger level adjusting variable resistor 209, and a voltage comparator 243 for receiving and comparing an output of the differentiator circuit and an output of the variable resistor 209. The trigger circuit 240 thus serves as an automatic fetching or triggering means for automatically detecting a pulse signal from an input signal from the probe 215 and forwarding the detected pulse signal to the oscilloscope 210 and a data processing device.

The oscilloscope operation supporting device 201 further includes a microcomputer or MPU 260, a digital to analog converter 250 for converting a digital data into an analog value, a ROM 262 and a RAM 264. The MPU 260 is connected to the operator guide display unit 202, ROM 262 and RAM 264 by way of a bus. The oscilloscope operation supporting device 201 further includes an AND gate 255 having a pair of input terminals one of which is connected to the MPU 260 and the other of which is connected to an output terminal of the trigger circuit 240. The AND gate 255 has an output terminal connected to the MPU 260 and also to the external trigger signal input terminal 218 of the oscilloscope 210. The reset switch 203, set switch 204 and OK switch 205 are also connected to the MPU 260.

Controlling operation of the oscilloscope operation supporting device 201 having such a construction as described above will be described below with reference to FIGS. 29, 30 and 31.

Figure 30A:
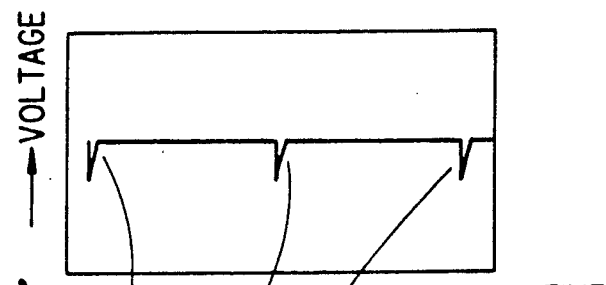
FIG. 30(a-b) is a waveform diagram illustrating an indication of the oscilloscope operation supporting device shown in FIG. 27.
Figure 30B:
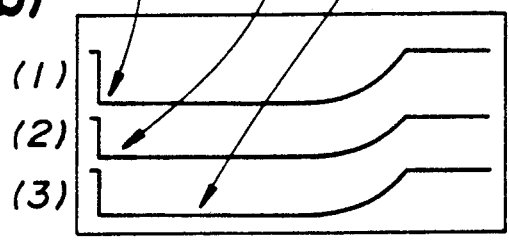
Figure 31A:
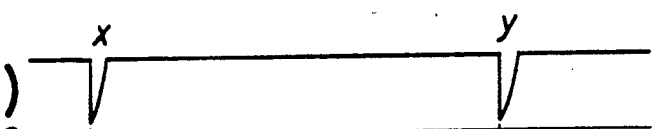
FIG. 31(a-e) is a waveform diagram showing waveforms at several components of the oscilloscope operation supporting device shown in FIG. 27.
Figure 31B:
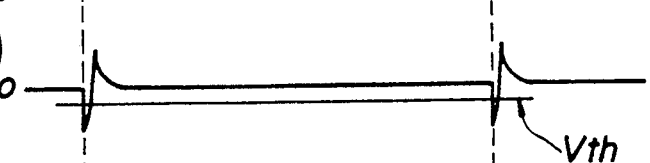
Figure 31C:
Figure 31D:
Figure 31E:
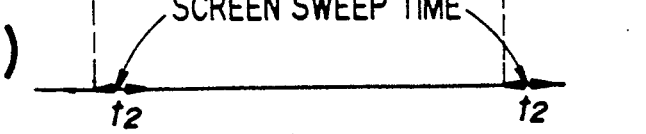

A waveform shown at (a) in FIG. 30 is derived from an injection valve controlling signal of a fuel injection device for an automobile as it is displayed on the oscilloscope 210. In the present embodiment, signals shown by the waveform (a) in FIG. 30 are edited so that they may be displayed in a parallel relationship as shown by waveforms (1), (2) and (3) at (b) in FIG. 30.

Figure 29:
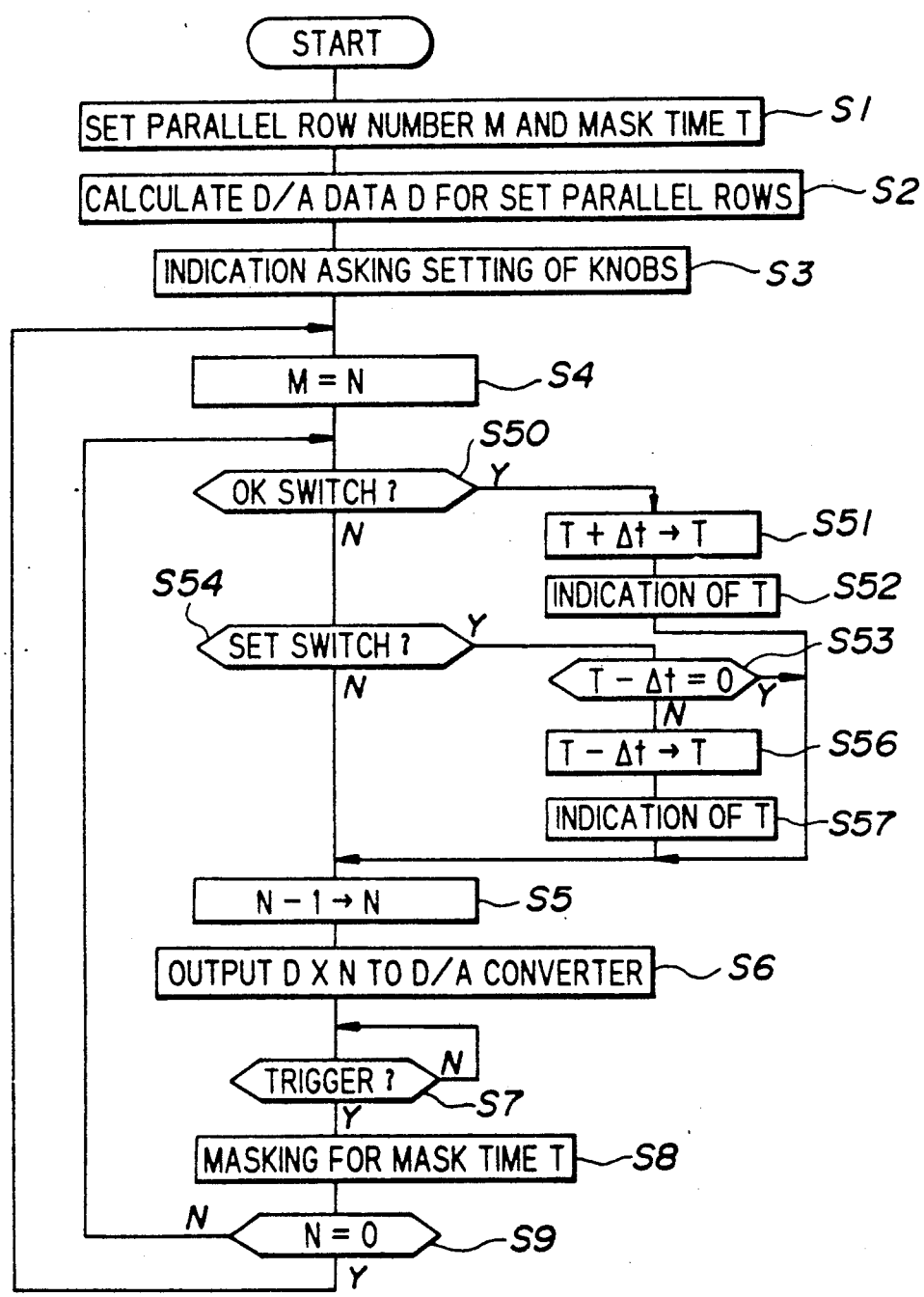
FIG. 29 is a flow chart illustrating controlling operation of the oscilloscope operation supporting device shown in FIG. 27.

After an operator observes a signal from the automobile appliance on the screen 211 of the oscilloscope 210, controlling operation is started in accordance with a flow chart shown in FIG. 29.

At first at step S1, the MPU 260 develops an instruction to make an indication to ask an operator to set a number of rows M in which signals are to be displayed on the screen 211 of the oscilloscope 210 and a mask time T for which input of a signal to the external (EXT) trigger signal input terminal 218 of the oscilloscope 210 is to be masked after a trigger signal is once received by the oscilloscope 210. The operator will thus set such a number of rows M and a mask time T in reply to the indications while observing waveforms displayed on the screen 211.

An example of setting of a number of rows M will be described with reference to FIG. 32 which illustrates an exemplary indication on the guide display unit 202 asking setting of a number of rows. In the example shown, portions "2" and "OK?" of the indication may be blinked. Observing the indication, the operator will depress the set switch 204. The indication of a numeral following the indication of "SET=" is successively updated in an order of 2, 3, 4, 5, ... 8, 1 each time the set switch 204 is depressed. If the OK switch 205 is depressed when the indication coincides a desired number, then the MPU 260 causes the data to be set and registered as a number of rows M into a predetermined address of the RAM 264. Also a mask time T can be registered in a similar manner into the RAM 264.

FIG. 33 shows an exemplary indication asking setting of a mask time. Here, a portion "5 ms. OK?" of the indication may be blinked. The operator will thus depress the set switch 204, and also in this instance, a numeral indicative of time is updated or incremented in the indication each time the set switch 204 is depressed. When a value indicative of a desired or aimed mask time is reached, the operator will depress the OK switch 205. As a result, the mask time T is registered into a predetermined address of the RAM 264.

Referring back to FIG. 29, a number D of data to be outputted from the digital to analog converter 250 for the number of rows is subsequently calculated at step S2. Where an input data to the digital to analog data consists of 8 bits, the maximum number is 255, and accordingly the number D is given by the following expression:

$$D = 255/(M-1) \quad (1)$$

Subsequently at step S3, an indication is made asking setting of the knobs for the vertical axis, horizontal axis, trigger position and so on. An exemplary indication is shown in FIG. 34. In accordance with the indication, the trigger source selection knob 220 of the oscilloscope 210 will be set to an external (EXT) mode in which triggering is effected in response to an external signal, and then the trigger adjusting knob 219 of the oscilloscope 210 and the trigger knob 209 and polarity switch 207 of the supporting device 201 will be adjusted to cause an input signal to be displayed stably on the screen 211 of the oscilloscope 210. In this instance, the MPU 26 controls such that the AND gate 255 is open so as to permit a signal to be accepted at the external trigger signal input terminal 218 of the oscilloscope 210.

It is also asked that the vertical axis setting knob 213 and horizontal axis setting knob 217 of the oscilloscope 210 may be set to individual values at which they may assume optimum positions for indication in parallel rows. The operator will thus operate in accordance with the indication and then depress the OK switch 205. Process thus advances to step S4 at which the MPU 260 replaces the parallel row number M with a loop variable N.

Steps S50 through S57 present operations to be executed when the OK switch 205 is depressed and when the OK switch 205 is not depressed but the set switch 204 is depressed. In particular, in case it is judged at step S50 that the OK switch 205 is not depressed, process advances to step S54. At step S54, the set switch 204 is checked, and in case the set switch 204 is not depressed, process advances to step S5.

At step S5, the value N is incremented by one, and then at step S6, a number of data equal to D×N are successively inputted to the digital to analog converter 250 at which they are converted into analog values, which are then transmitted to the adding circuit 234. The signal is a stair step signal having a waveform of a down stair step as shown at (d) in FIG. 31. Subsequently at step S7, the MPU 260 waits until such a trigger signal as shown by the waveform (c) in FIG. 31 is received, and after a trigger signal is received, the AND gate 255 is closed, at step S8, as seen at the waveform (d) in FIG. 31 for the mask time T registered by the operator so that no trigger signal may be transmitted to the MPU 260 nor to the external trigger signal input terminal 218 of the oscilloscope 210. In this instance, where the sweep time of the screen 211 coincides with the value set at step S3, that is, when the sweep time is set to such a time as shown at (e) in FIG. 31 by means of the oscilloscope 210, such a waveform as shown at (1) of (b) of FIG. 30 can be obtained.

Subsequently at step S9, it is judged whether or not N is equal to zero, and in case the judgement is "NO", sequence returns to step S50, but on the contrary if the judgement is "YES", then sequence returns to step S4. In either case, the sequence of operations described hereinabove are repeated. With the operations described above, where an input signal is represented by S, the digital to analog converter 250 can successively output a divided or stair step voltage signal of S, S+2D, S+D and S. Then, where the mask time T is set smaller than a pulse period (interval of time between x and y shown in FIG. 31) is set as shown in FIG. 31, each time an input signal is received, a trigger signal is applied to the external trigger signal input terminal 218 of the oscilloscope 210 as seen at the waveform (c) in FIG. 31, and accordingly, for each input signal, parallel waveforms are indicated in a preset number of rows on the screen 211 of the oscilloscope 210 as seen at (b) in FIG. 30.

Where the mask time T is set longer than the pulse period of the waveform (a) shown in FIG. 31, parallel waveforms can be displayed for every other pulse or for every pulses spaced by a plurality of pulse spaces of an original waveform of an input signal. In particular, a waveform of series pulses shown at (a) in FIG. 30 is edited into and displayed as parallel waveforms of pulses enlarged in an order of the waveforms (1), (2) and (3) shown at (b) in FIG. 30.

Referring back to FIG. 29, in case the OK switch 205 is depressed at step S50, sequence advances to step S51 at which a value of the mask time T added by Δt is registered as a new mask time. The new mask time T is indicated on the operator guide display unit 202, whereafter process advances to step S5.

An exemplary indication at step S52 is shown in FIG. 35. If it is assumed, for example, that T=15 milliseconds and Δt=1 millisecond before processing at step S51, the mask time after execution of step S51 is 16 milliseconds, and the gate 255 is controlled for the time thus specified while such an indication as shown in FIG. 35 is made. In short, steps S51 and S52 provide processing to increment T by Δt each time the OK switch 205 is depressed.

If it is assumed that the period between the pulse signals x and y shown in FIG. 31 is 15 milliseconds, such waveforms as shown at (b) in FIG. 31 are displayed on the oscilloscope 210 within a range of 0<T<15, but in another range of 15<T<30, the pulse signal y is not displayed because T shown at (d) in FIG. 31 exceeds the pulse signal 6, and consequently, a pulse next to the pulse signal y (pulse signal (3) shown in FIG. 30) is displayed instead of the signal waveform y shown at (b) in FIG. 31. The operator can thus operate such a change while observing the oscilloscope 210.

Similarly, in case the set switch 204 is depressed at step S54, process advances to step S55. At step S55, it is judged whether or not T−Δt=0, that is, a minimum value of the mask time T is judged. In case the judgement is "YES", process advances to step S5. On the contrary the judgement is "NO", process advances to step S56 at which T is incremented by Δt similarly as at step S51 to change the mask time, and then to step S57 at which the mask time T thus changed is indicated on the display unit 202. After then, process advances also to step S5.

With the controlling operations described above, when, for example, abnormal pulses which may appear frequently are to be observed, an interval between abnormal pulses or only abnormal pulses can be displayed in a parallel configuration. Accordingly, the oscilloscope can be used for applied measurement.

With the oscilloscope operation supporting device of the present embodiment, waveforms can be displayed in a parallel configuration on a system including an oscilloscope on the market. Further, while an operator observes the oscilloscope, a display of pulse signals spaced by one or more pulse spaces can be attained by a simple operation.

Figure 36:
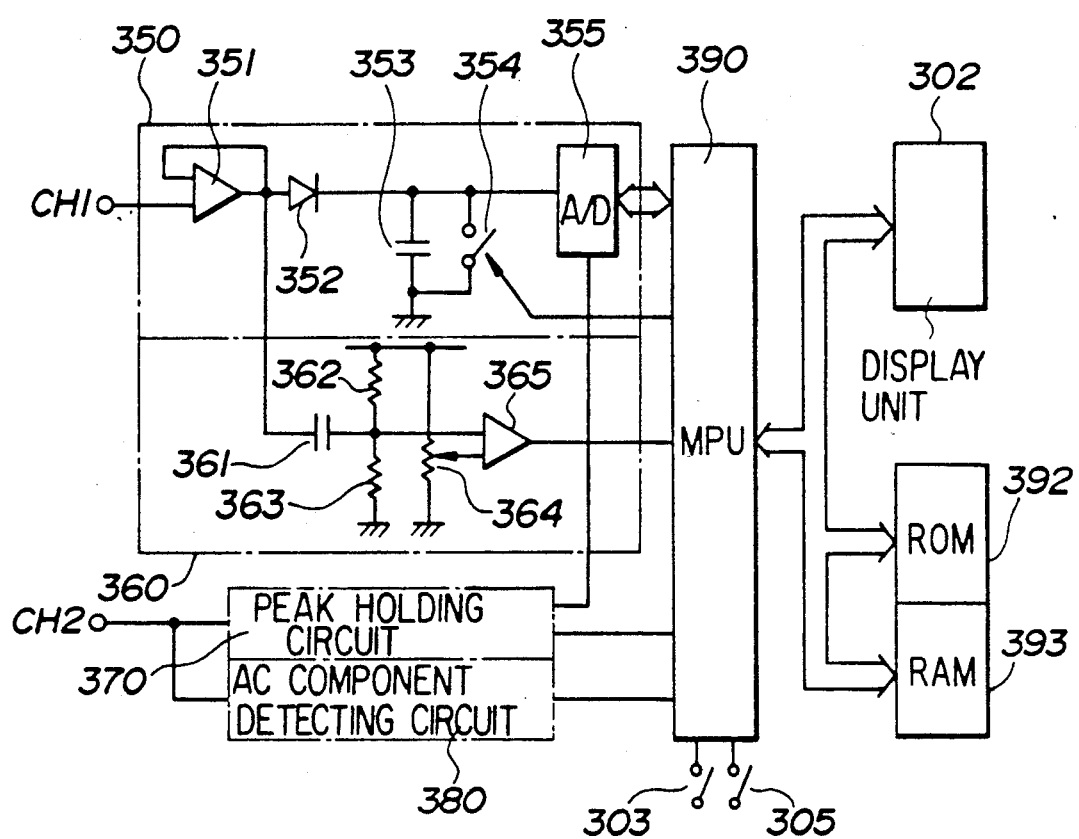
FIG. 36 is a block diagram of an oscilloscope operation supporting device showing a yet further embodiment of the present invention.

Referring now to FIG. 36, there is shown an electric circuit of an oscilloscope operation supporting device according to a yet further embodiment of the present invention.

A signal transmitted over a signal branch line is received at a terminal CH1 or CH2 for a first or a second channel.

On the first channel CH1 side, an input signal is reinforced in input impedance by a voltage follower 351. An output terminal of the voltage follower 351 is grounded by way of a diode 352 and a capacitor 353. A discharging switch 354 is connected in parallel to the capacitor 353, and an analog to digital converter 55 is connected to convert a voltage across the capacitor 353 into a digital signal. The voltage follower 351, diode 352, capacitor 353, discharging switch 354 and analog to digital converter 355 generally constitute a peak holding circuit 350.

The output terminal of the voltage follower 351 is also connected by way of a capacitor 361 to a junction between a pair of resistors 362 and 363, thereby constituting an ac signal fixed bias circuit. An output terminal of the ac signal fixed bias circuit is connected to one of a pair of input terminals of a voltage comparator 365, and an output terminal of a voltage setter 364 is connected to the other input terminal of the voltage comparator 365. The capacitor 361, resistors 362 and 363, voltage setter 364 and voltage comparator 365 constitute an ac component detecting circuit 360.

Though not particularly shown, the second channel CH2 includes, similarly to the CH1 side, a peak holding circuit 370 constituted from a voltage follower, a diode, a capacitor, a discharging switch and an analog to digital converter not shown, and an ac component detecting circuit 380 constituted from a capacitor, a pair of resistors, a voltage setter and a voltage comparator not shown.

Outputs of the peak holding circuits 350 and 370 and ac component detecting circuits 360 and 380 of the first and second channels CH1 and CH2, respectively, are connected to a microcomputer or MPU 390. The MPU 390 is further connected to a ROM 392, a RAM 393 and the operator guide display unit 302 over a data bus. A pair of switches 303 and 305 are also connected to the MPU 390. The MPU 390 performs processing of data from the circuits 350, 360, 370 and 380, various calculations and delivery of instructions to the display unit 302 for indication.

Subsequently, controlling operation of the oscilloscope operation supporting device will be described with reference to FIG. 37.

Figure 37A:
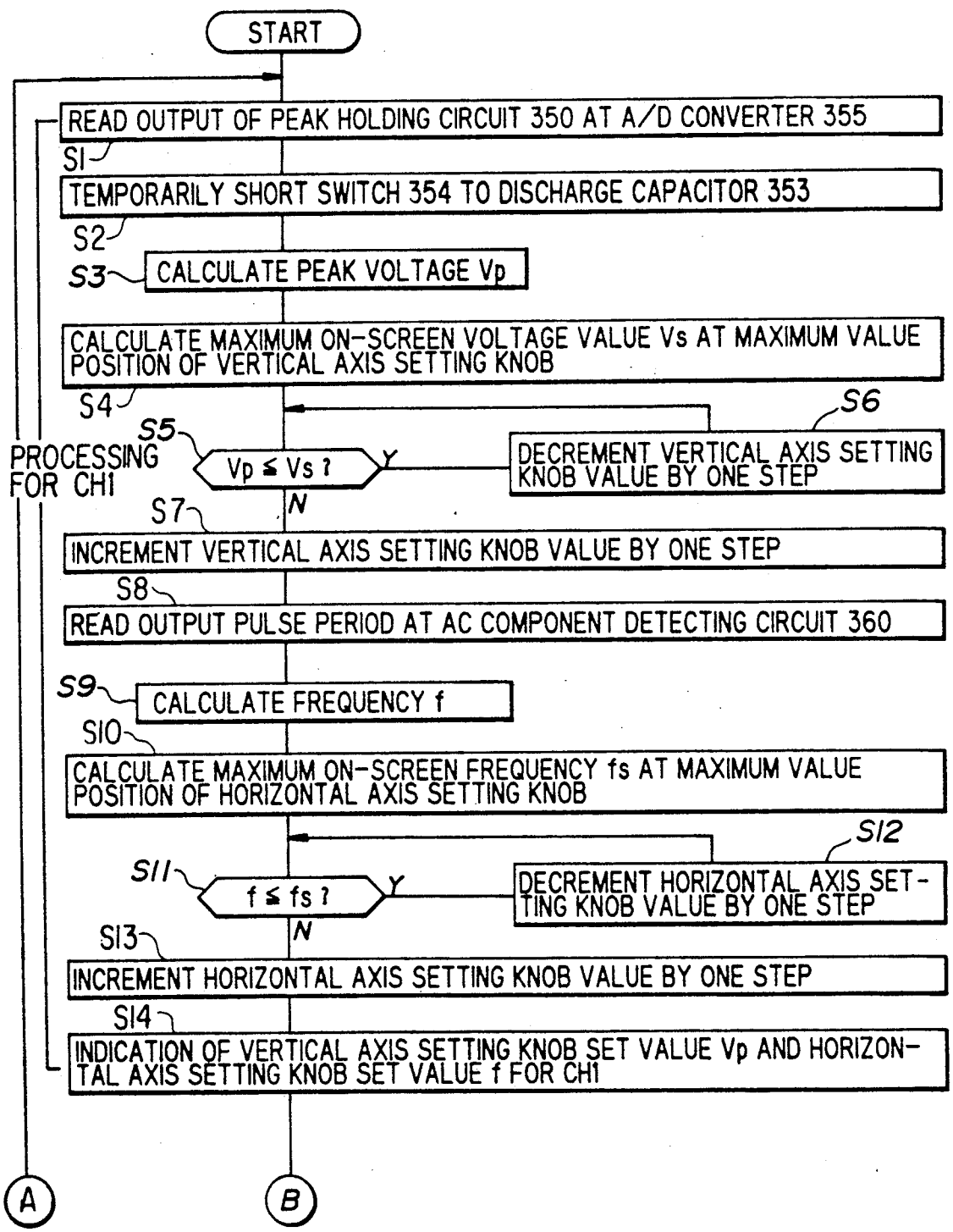
FIG. 37 is a flow chart illustrating operation of the oscilloscope operation supporting device shown in FIG. 36.

A routine shown in FIG. 37 starts in response to depression of the operation switch 305, and in the routine, processing for the first channel CH1 is executed from step S1 to S14.

In particular, at step S1, an output of the analog to digital converter 355 of the peak holding circuit 350 is fetched. Then at step S2, the discharging switch 354 is temporarily shorted to discharge the capacitor 353 completely and is then opened again so as to start preparation for a next peak holding operation.

Subsequently at step S3, a peak voltage value Vp is calculated in accordance with the data from the analog to digital converter 355 and is temporarily stored into a predetermined address of the RAM 393. Then at step S4, a maximum on-screen voltage value Vs when a vertical axis setting knob of the oscilloscope is adjusted to its maximum position is calculated. The maximum on-screen voltage value Vs and the peak voltage value Vp are compared with each other at step S5, and in case $Vp \leq Vs$, the vertical axis setting knob value is decremented by one step at step S6 and then process returns to step S5. After operations of steps S5 and S6 are repeated until the peak voltage value Vp exceeds the maximum on-screen voltage value Vs, process advances to step S7 at which the vertical axis setting knob value is incremented by one step, and the thus incremented knob value is determined as a preset vertical axis knob value. Thus, a preset vertical axis knob value for the first channel CH1 is calculated by the steps from S3 to S7 in this manner, and the preset value is temporarily stored into a predetermined address of the RAM 393.

Subsequently at step S8, pulse signals from the ac component detecting circuit 360 are counted for a predetermined period of time to find out a period of pulses to be outputted, and then at step S9, a frequency f is calculated and stored into a predetermined address of the RAM 393. Then, a maximum on-screen frequency fs when a horizontal axis setting knob of the oscilloscope is adjusted to its maximum position is calculated at step S10, and the frequency f calculated at step S9 and the maximum on-screen frequency fs calculated at step S10 are compared with each other at step S11. In case the result of comparison proves that $f \leq fs$, the horizontal axis knob value is incremented by one step at step S12, and process returns to step S11. After operations of steps S11 and S12 are repeated until the frequency f exceeds the maximum on-screen frequency fs, process advances to step S13 at which the horizontal axis setting knob value is incremented by one step, and the thus incremented knob value is determined as a preset horizontal axis knob value. Thus, a preset horizontal axis knob value for the first channel CH1 is calculated by the steps from S8 to S13 in this manner, and the preset value is temporarily stored into a predetermined address of the RAM 393. Subsequently at step S14, the preset vertical axis knob value Vp and the preset horizontal axis knob value f for the first channel CH1 are indicated as guide information for the first channel CH1 on the operator guide display unit 302.

After then, processing for the second channel CH2 is executed at steps S15 to S28.

Processing operations at steps S15 to S28 are similar to the processing operation for the first channel CH1 at steps S1 to S14 described hereinabove. In particular, an output of the peak holding circuit 370 is fetched at step S15, and then at step S16, the discharging switch not shown of the peak holding circuit 370 is temporarily shorted to completely discharge the capacitor not shown. Subsequently at step S17, a peak voltage value Vp is calculated in accordance with the data from the analog to digital converter not shown and is temporarily stored into a predetermined address of the RAM 393. Then at step S18, a maximum on-screen voltage value Vs when the vertical axis setting knob of the oscilloscope is adjusted to its maximum position is calculated. The maximum on-screen voltage value Vs and the peak voltage value Vp are compared with each other at step S19, and in case $Vp \leq Vs$, the vertical axis setting knob value is decremented by one step at step S20 and then process returns to step S19. After the operations of steps S19 and S20 are repeated until the peak voltage value Vp exceeds the maximum on-screen voltage value Vs, process advances to step S21 at which the vertical axis setting knob value is incremented by one step, and the thus incremented knob value is determined as a preset vertical axis knob value. Thus, a preset vertical axis knob value Vp now for the second channel CH2 is calculated by the steps from S17 to S21 in this manner, and the preset value Vp is temporarily stored into a predetermined address of the RAM 393.

Subsequently at step S22, pulse signals from the ac component detecting circuit 380 are counted for a predetermined period of time to find out a period of pulses to be outputted, and then at step S23, a frequency f is calculated and stored into a predetermined address of the RAM 393. Then, a maximum on-screen frequency fs when the horizontal axis setting knob of the oscilloscope is adjusted to its axis position is calculated at step S24, and the frequency f calculated at step S23 and the maximum on-screen frequency fs calculated at step S24 are compared with each other at step S25. In case the result of comparison proves that $f \leq fs$, the horizontal axis knob value is incremented by one step at step S26, and process returns to step S25. After the operations of steps S25 and S26 are repeated until the frequency f exceeds the maximum on-screen frequency fs, process advances to step S27 at which the horizontal axis setting knob value is incremented by one step, and the thus incremented knob value is determined as a preset horizontal axis knob value. Thus, a preset horizontal axis knob value for the second channel CH2 is calculated by the steps from S22 to S27 in this manner, and the preset value is temporarily stored into a predetermined address of the RAM 393. Subsequently at step S28, the preset vertical axis knob value Vp and the preset horizontal axis knob value f for the second channel CH2 are indicated as guide information for the second channel CH2 on the operator guide display unit 302. Finally at step S29, it is judged whether a reset switch is depressed or not, and in case the reset switch is not depressed, process returns to step S1 in order to repeat the sequence of operations described above. When a level of an input signal from a signal retrieving probe is fluctuated, the oscilloscope operation supporting device will receive the data and automatically update data stored therein. Contents of the thus updated data can be indicated on the operator guide display unit 302 by way of processing of the sequence of operations described above.

While in the embodiment described above information of operation includes information of the vertical axis knobs and information of the horizontal axis knobs, the present invention is not limited to the specific embodiment. Where the oscilloscope operation supporting device is used as an operation supporting device for an oscilloscope for maintenance and inspection of an automobile appliance, it can be applied, in addition to such information as described above, for brightness adjustment information, focusing information, scale calibration information and probe matching information.

The present invention can be further applied to an operation supporting device for an oscilloscope which is used to make measurement of any appliance or device other than an automobile appliance.

What is claimed is:

1. An oscilloscope operation supporting device for use with an oscilloscope, comprising an automatic signal fetching means for automatically detecting a timing at which a signal is delivered from an appliance to be measured, a data processing means for processing a signal fetched by said automatic signal fetching means, and an adding means for adding a predetermined signal to the signal from the appliance to be measured, whereby an output of said automatic signal fetching means and an output of said adding means are outputted to input terminals of an oscilloscope connected to said oscilloscope operation supporting device so that a waveform of the signal is displayed on a screen of said oscilloscope.

2. An oscilloscope operation supporting device as claimed in claim 1, wherein the predetermined adding signal of said adding means is an output signal of a digital to analog converter provided in said data processing means and developed when an output data of said data processing means is received by said digital to analog converter and converted into an analog value by said digital to analog converter.

3. An oscilloscope operation supporting device as claimed in claim 1, wherein an output of said automatic signal fetching means is inputted to an external trigger input terminal of said oscilloscope via a signal interrupting means which is controlled by said data processing means.

4. An oscilloscope operation supporting device as claimed in claim 3, wherein an interrupting time of said signal interrupting means is set by a signal inputting means which is provided for inputting a signal manually or automatically to said data processing means, 5. An oscilloscope operation supporting device as claimed in claim 4, wherein an output value of an analog signal can be set into a plurality of divided signals each for a predetermined period of time by said signal inputting means, and a signal waveform can be displayed in a plurality of parallel rows on said screen of said oscilloscope.

6. An oscilloscope operation supporting device as claimed in claim 5, wherein the predetermined period of time is a plurality of times as long as a period of the input signal.

7. An oscilloscope operation supporting device as claimed in claim 1, wherein a predetermined adding signal of said adding means is a fixed voltage value.

8. An oscilloscope operation supporting device to be provided as a unit discrete and independent from an oscilloscope so as to display operation procedures of said oscilloscope as a guide for an operator, comprising:
    (a) an operation guide display means for displaying basic operation items of said oscilloscope;
    (b) a data processing means for displaying on said display means operation procedures, which correspond to operation items selected from said basic operation items, in accordance with a program stored in advance;
    (c) an inputting means including a means for inputting an operation completion signal upon completion of an operation in accordance with said operation procedures; and
    (d) a controlling means including a means for determining whether said operation completion signal is inputted at the same time to said oscilloscope or via an oscilloscope operation supporting device, said controlling means controlling a switch means in response to an output from said determining means.

9. An oscilloscope operation supporting device to be provided as a unit discrete and independent from an oscilloscope so as to display operation procedures of said oscilloscope as a guide for an operator, comprising:
    (a) an inputting means including an analog-to-digital converter for converting an inputted analog signal into a digital signal;
    (b) a data processing means for receiving the digital signal, which has been converted by said analog-to-digital converter, and subjecting said digital signal to data processing;

(c) a memory means for storing said data processed by said data processing means;
(d) an operator guide display means connected to said data processing means for displaying operation items to be chosen by said operator; and
(e) a digital-to-analog converter for converting said digital data, which are stored in said memory means, into analog data in order to display said digital data on said oscilloscope.

10. An oscilloscope operation supporting device as claimed in claim 9, wherein said oscilloscope operation supporting device outputs, when the stored data are to be indicated on said screen of said oscilloscope, pulse signals to an external trigger input terminal of said oscilloscope so as to establish synchronization between said oscilloscope and said oscilloscope operation supporting device.

11. An oscilloscope operation supporting device as claimed in claim 9, wherein a signal for measurement from an appliance to be measured can be fetched to a single channel or to either one or both of two channels of said oscilloscope operation supporting device.

12. An oscilloscope operation supporting device as claimed in claim 9, wherein the operation items include a vertical axis knob setting value of said oscilloscope.

13. An oscilloscope operation supporting device as claimed in claim 9, wherein the operation includes a horizontal axis knob setting value of said oscilloscope.

14. An oscilloscope operation supporting device as claimed in claim 9, wherein, when the stored data are to be indicated on said screen of said oscilloscope, the stored data can be indicated beginning with an arbitrary one, and those of the stored data which follow the arbitrary one are indicated in an order in which the data are stored in said memory.

15. An oscilloscope operation supporting device as claimed in claim 14, wherein an absolute value of a voltage of a first one of the stored data which is to be outputted to said oscilloscope is indicated on said display means.

16. An oscilloscope operation supporting device as claimed in claim 14 or 15, wherein a time of delay of a first one of the stored data which is to be outputted to said oscilloscope is indicated on said display means.

17. An oscilloscope operation supporting device as claimed in claim 9, wherein a backup power source is connected to said controlling means.

18. An oscilloscope operation supporting device as claimed in claim 9, wherein said memory for storing data therein includes an external memory.

19. An oscilloscope operation supporting device as claimed in claim 18, wherein said external memory is a record medium in the form of a disk.

20. An oscilloscope operation supporting device as claimed in claim 9, wherein a signal for measurement from the appliance to be measured can be reproduced on said screen of said oscilloscope in a reduced scale of time with respect to a time for which the signal is fetched.

21. An oscilloscope operation supporting device for use with an oscilloscope, comprising a trigger circuit for detecting a timing at which a signal is delivered from an appliance to be measured, a data processing means for receiving and processing data of an output signal fetched from the appliance to be measured and an output signal of said trigger circuit, an adding means for adding a predetermined signal to the signal fetched from the appliance to be measured, an operation information inputting means for inputting information from an operator, an output of said trigger circuit and an output of said adding circuit being inputted to a trigger input terminal and a signal input terminal, respectively, of an oscilloscope connected to said oscilloscope operation supporting device so as to be displayed on a screen of said oscilloscope, and a waveform moving means for moving a display time zone of a displayed waveform on said screen of said oscilloscope in response to operation of said operation information inputting means.

22. An oscilloscope operation supporting means as claimed in claim 21, wherein said waveform moving means masks at least part of an indication on said screen to enable intermittent indication.

23. An oscilloscope operation supporting means as claimed in claim 22, further comprising a means for changing an amount of time for which said at least part of the indication is masked in accordance with a change in cycle of said signal delivered from said appliance.

24. An oscilloscope operation supporting means as claimed in claim 22, wherein a period of time for which an indication is masked is a plurality of times as long as a period of variation of a waveform to be observed by way of the indication.

25. An oscilloscope operation supporting device to be provided as a unit discrete and independent from an oscilloscope so as to display operation procedures of said oscilloscope as a guide for an operator, comprising:
(a) an analog-to-digital converter for converting, into a digital signal, an analog signal from an appliance to be measured;
(b) an automatic fetching starting means for automatically starting fetching of a signal from said appliance;
(c) a data processing means for receiving said digital signal from said analog-to-digital converter for a predetermined time period set by said automatic fetching starting means, said data processing means being adapted to process said digital signal:
(d) a memory means for storing therein processed signals processed by said data processing means;
(e) a digital-to-analog converter for converting display signals, which are outputted from said data processing means to said oscilloscope and consist of digital signals, into analog display signals, whereby fetching of the signals from the appliance to be measured is continued for a preset period of time after having been automatically started by said automatic fetching starting means, and data of the signals thus fetched are stored in said memory means thereby to enable, when required, the stored data to be converted into analog data, outputted to an input terminal of said oscilloscope connected to said oscilloscope operation supporting device and indicated on a screen of said oscilloscope.

26. An oscilloscope operation supporting device as claimed in claim 25, wherein said automatic fetching starting means includes a differentiator circuit for receiving signals from said appliance and a comparator circuit for receiving outputs from said differentiator circuit.

27. An oscilloscope operation supporting device as claimed in claim 25, wherein said automatic fetching starting means includes a variable resistor.

28. An oscilloscope operation supporting device as claimed in claim 25, wherein said automatic fetching starting means starts fetching of data when a rate of change in value of the inputted signal exceeds a reference value.

29. An oscilloscope operation supporting device as claimed in claim 25, wherein said automatic fetching starting means includes a change-over means for alternatively accepting starting of a positive signal or starting of a negative signal.

30. An oscilloscope operation supporting device as claimed in claim 25, wherein said automatic fetching starting means includes a manually operable change-over means for manually starting fetching of data.

31. An oscilloscope operation supporting device as claimed in claim 25, wherein the input signal from the appliance to be measured is fetched repetitively for a predetermined period of time after automatic starting of fetching, and data of the signal are stored into said memory means.

32. An oscilloscope operation supporting device as claimed in claim 25, wherein said automatic fetching starting means includes a means for changing a reference level so as to set a last measured value as a new reference level when the absolute value of a difference between a previous reference level and the last measured value has exceeded a preset value.

33. An oscilloscope operation supporting device to be provided as a unit discrete and independent from an oscilloscope and to be connected to said oscilloscope so as to support operation of said oscilloscope, comprising:
   (a) an automatic signal fetching means for automatically detecting a timing of generation of a signal from an appliance to be measured;
   (b) a data processing means for processing the signal fetched by said automatic signal fetching means and outputting a processed signal;
   (c) an adder means for adding a predetermined signal to the processed signal from said appliance;
   (d) a display controlling means for outputting an output from said automatic signal fetching means and an output from said adder means to an input terminal of said oscilloscope, whereby a signal waveform is displayed on a screen of said oscilloscope;
   (e) a display means for displaying knob values which set a voltage axis and a time axis on said screen of said oscilloscope, respectively; and
   (f) an operation display control means for displaying the knob values on said display means in accordance with a program stored in advance in a storing means.

34. An oscilloscope operation supporting device to be provided as a unit discrete and independent from an oscilloscope and to be connected to said oscilloscope so as to support operation of said oscilloscope, comprising:
   (a) an automatic signal fetching means for automatically detecting a timing of generation of a signal from an appliance to be measured;
   (b) a data processing means for processing the signal fetched by said automatic signal fetching means;
   (c) an adder means for adding a predetermined signal to the processed signal from said appliance;
   (d) a display controlling means for outputting an output from said automatic signal fetching means and an output from said adder means to an input terminal of said oscilloscope, whereby a signal waveform is displayed on a screen of said oscilloscope;
   (e) a display means for displaying, until the display on said screen of said oscilloscope becomes stable, a knob value adapted to adjust a trigger knob;
   (f) an operation display control means for displaying the knob value on said display means in accordance with a program stored in advance in a storing means.

35. An oscilloscope operation supporting device to be provided as a unit discrete and independent from an oscilloscope and to be connected to said oscilloscope so as to support operation of said oscilloscope, comprising;
   (a) a trigger circuit for detecting a timing of generation of a signal from an appliance to be measured;
   (b) a data processing circuit for receiving the signal fetched from said appliance to be measured and a signal outputted from said trigger circuit and performing data processing on the signals;
   (c) an adder means for adding a predetermined signal to the signal fetched from said appliance;
   (d) an operational information inputting means for permitting input of information from an operator;
   (e) a waveform moving means for inputting an output from said trigger circuit and an output from said adder means to a trigger input terminal and a signal input terminal of said oscilloscope, respectively to display the waveform of said adder means output in synchronization with said trigger circuit output on a screen of said oscilloscope and moving display time zone of the so-displayed waveform on said screen of said oscilloscope;
   (f) a means for displaying knob values which set the scales of a voltage axis and a time axis, respectively on said screen of said oscilloscope; and
   (g) an operation display control means for causing said display means to display the knob values in accordance with a program stored in advance in a storing means.

* * * * *